US008340932B2

United States Patent
Ichikawa

(10) Patent No.: US 8,340,932 B2
(45) Date of Patent: Dec. 25, 2012

(54) VEHICLE POWER SUPPLY DEVICE AND METHOD OF ESTIMATING STATE OF CHARGE OF POWER STORAGE DEVICE IN VEHICLE POWER SUPPLY DEVICE

(75) Inventor: Shinji Ichikawa, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 452 days.

(21) Appl. No.: 12/451,375

(22) PCT Filed: Jun. 19, 2008

(86) PCT No.: PCT/JP2008/061601
§ 371 (c)(1),
(2), (4) Date: Nov. 10, 2009

(87) PCT Pub. No.: WO2008/156212
PCT Pub. Date: Dec. 24, 2008

(65) Prior Publication Data
US 2010/0131217 A1 May 27, 2010

(30) Foreign Application Priority Data
Jun. 20, 2007 (JP) .................................. 2007-162657

(51) Int. Cl.
*G01R 31/36* (2006.01)
(52) U.S. Cl. .......................................................... 702/63
(58) Field of Classification Search ...................... 702/63
See application file for complete search history.

(56) References Cited

U.S. PATENT DOCUMENTS

| 5,677,604 A | 10/1997 | Masaki et al. |
| 2008/0036417 A1* | 2/2008 | Toya et al. ..................... 320/101 |
| 2009/0039831 A1* | 2/2009 | Ichikawa ....................... 320/118 |
| 2010/0134065 A1* | 6/2010 | Iida .............................. 320/103 |

FOREIGN PATENT DOCUMENTS

| JP | A-06-059003 | 3/1994 |
| JP | A-07-193910 | 7/1995 |
| JP | A-08-019114 | 1/1996 |
| JP | A-08-205304 | 8/1996 |
| JP | A-10-051906 | 2/1998 |
| JP | A-11-121048 | 4/1999 |
| JP | A-2001-268807 | 9/2001 |
| JP | A-2002-010502 | 1/2002 |
| JP | A-2006-033970 | 2/2006 |
| JP | A-2007-071535 | 3/2007 |

OTHER PUBLICATIONS

International Search Report issued in International Application No. PCT/JP2008/061601; Mailed on Sep. 16, 2008.

* cited by examiner

*Primary Examiner* — Michael Nghiem
(74) *Attorney, Agent, or Firm* — Oliff & Berridge, PLC

(57) ABSTRACT

A vehicle power supply device includes a battery, a charging device (a charger, booster converters and inverters capable of performing an internal charging operation for performing charging with an electric power generated by a motor generator and an external charging operation for performing charging by coupling to a power supply outside the vehicle, and a control device detecting a state of charge of the battery and controlling the charging device. The control device executes a first estimation processing of estimating the state of charge in the internal charging operation and a second estimation processing of estimating the state of charge in the external charging operation.

20 Claims, 16 Drawing Sheets

VEHICLE POWER SUPPLY DEVICE AND METHOD OF ESTIMATING STATE OF CHARGE OF POWER STORAGE DEVICE IN VEHICLE POWER SUPPLY DEVICE

TECHNICAL FIELD

The invention relates to a vehicle power supply device (i.e., a power supply device for a vehicle) and a method of estimating a state of charge of a power supply device in the vehicle power supply device, and particularly to a vehicle power supply device configured to allow external charging as well as a method of estimating a state of charge of the power supply device in the vehicle power supply device.

BACKGROUND ART

In recent years, hybrid vehicles that use a combination of an electric motor and an engine for driving wheels have attracted attention as environmentally friendly vehicles. It has been studied to provide a hybrid vehicle configured to allow external charging. The vehicle thus configured can be charged at home or the like, and therefore will go to gas stations for refueling fewer times, which is convenient for a driver. Also, an inexpensive midnight electric power or the like can be used. Therefore, this structure can be cost-justified.

Japanese Patent Laying-Open No. 8-19114 has disclosed a hybrid vehicle having an externally chargeable battery.

When an electric vehicle or a hybrid vehicle has a battery that can be externally charged, it is desired or required to charge the battery with as much energy as possible by the external charging, i.e., the charging performed from an outside of the vehicle. For such charging, it is necessary to sense an SOC (State Of Charge) of the battery with high accuracy and thereby to prevent overcharge.

Various methods have been studied for sensing the SOC of the battery. However, it is difficult to observe directly the SOC, and it has been generally performed to estimate the SOC from externally observable voltage and/or current. However, when the changing and discharging of the battery are repeated while estimating the SOC, an error in estimation increases.

DISCLOSURE OF THE INVENTION

An object of the invention is to provide a vehicle power supply device that has an improved accuracy of sensing a state of charge of an externally chargeable power storage device as well as a method of estimating the SOC of the power storage device in the vehicle power supply device.

In summary, the invention provides a vehicle power supply device (i.e., power supply device for a vehicle) including a power storage device, a charging device being capable of performing an internal charging operation for charging the power storage device with an electric power generated by a power generator inside the vehicle and an external charging operation for charging the power storage device by coupling to a power supply outside the vehicle, and a control device for sensing a state of charge of the power storage device and controlling the charging device. The control device executes first estimation processing of estimating the state of charge of the power storage device when the internal charging operation is being performed in the charging device, and second estimation processing of estimating the state of charge of the power storage device when the external charging operation is being performed on the charging device.

Preferably, the power generator inside the vehicle generates the electric power by receiving a drive power from an internal combustion engine inside the vehicle, and the charging device executes the internal charging operation for converging the state of charge of the power storage device to a target value during running of the vehicle.

Preferably, the power generator inside the vehicle performs a regenerative operation during wheel braking, and the charging device executes the internal charging operation during running of the vehicle.

Preferably, the control device executes a reset operation of discharging the power storage device and setting the state of charge of the power storage device to a predetermined state prior to the external charging operation when execution of the external charging operation is selected.

Preferably, the vehicle power supply device further includes a map defining a relationship between an upper limit value of a discharge power of the power storage device and the state of charge of the power storage device. The map includes a first map being referred to during running of the vehicle, and a second map being referred to during execution of the reset operation, and being configured such that an upper limit value of a discharge power of the second map on a lower limit side of the state of charge is relaxed as compared with that of the first map.

Preferably, the vehicle power supply device includes a current sensing unit for sensing a current flowing into the power storage device, and a voltage sensing unit for sensing a voltage of the power storage device. The first estimation processing obtains a sum of a value obtained by multiplying, by a predetermined weighting coefficient, a result of first calculation of estimating the state of charge by integrating the current sensed by the current sensing unit and a value obtained by multiplying, by a predetermined weighting coefficient, a result of second calculation of estimating the state of charge based on the voltage sensed by the voltage sensing unit. The second estimation processing obtains a sum of the results of the first calculation and the second calculation multiplied by a weighting coefficient different from the coefficient used in the first estimation unit.

According to another aspect, the invention provides a method of estimating a state of charge of a power storage device in a vehicle power supply device including a power storage device, and a charging device being capable of performing an internal charging operation for charging the power storage device with an electric power generated by a power generator inside the vehicle and an external charging operation for charging the power storage device by coupling to a power supply outside the vehicle. The method includes a first estimation step of estimating the state of charge of the power storage device when the internal charging operation is being performed in the charging device, and a second estimation step of estimating the state of charge of the power storage device when the external charging operation is being performed on the charging device.

Preferably, the power generator inside the vehicle generates the electric power by receiving a drive power from an internal combustion engine inside the vehicle, and the charging device executes the internal charging operation for converging the state of charge of the power storage device to a target value during running of the vehicle.

Preferably, the power generator inside the vehicle performs a regenerative operation during wheel braking, and the charging device executes the internal charging operation during running of the vehicle.

Preferably, the method of estimating the state of charge further includes a reset step of discharging the power storage device and setting the state of charge of the power storage device to a predetermined state prior to the external charging operation when execution of the external charging operation is selected.

More preferably, the vehicle power supply device further includes a map defining a relationship between an upper limit value of a discharge power of the power storage device and the state of charge of the power storage device. The map includes a first map being referred to during running of the vehicle, and a second map configured such that an upper limit value of a discharge power of the second map on a lower limit side of the state of charge is relaxed as compared with that of the first map. The reset step discharges the power storage device with reference to the second map.

Preferably, the vehicle power supply device further includes a current sensing unit for sensing a current flowing into the power storage device, and a voltage sensing unit for sensing a voltage of the power storage device. The first estimation step obtains a sum of a value obtained by multiplying, by a predetermined weighting coefficient, a result of first calculation of estimating the state of charge by integrating the current sensed by the current sensing unit and a value obtained by multiplying, by a predetermined weighting coefficient, a result of second calculation of estimating the state of charge based on the voltage sensed by the voltage sensing unit. The second estimation processing obtains a sum of the results of the first calculation and the second calculation multiplied by a weighting coefficient different from the coefficient used in the first estimation unit.

According to the invention, the accuracy of sensing the state of charge of the power supply device is improved so that the power supply device can be charged by the external charging until the device reaches the state of charge close to the upper limit value.

BEST MODES FOR CARRYING OUT THE INVENTION

Embodiments of the invention will now be described with reference to the drawings. In the following description, the same or corresponding portions bear the same reference numbers, and description thereof is not repeated.

First Embodiment

Figure 1A:
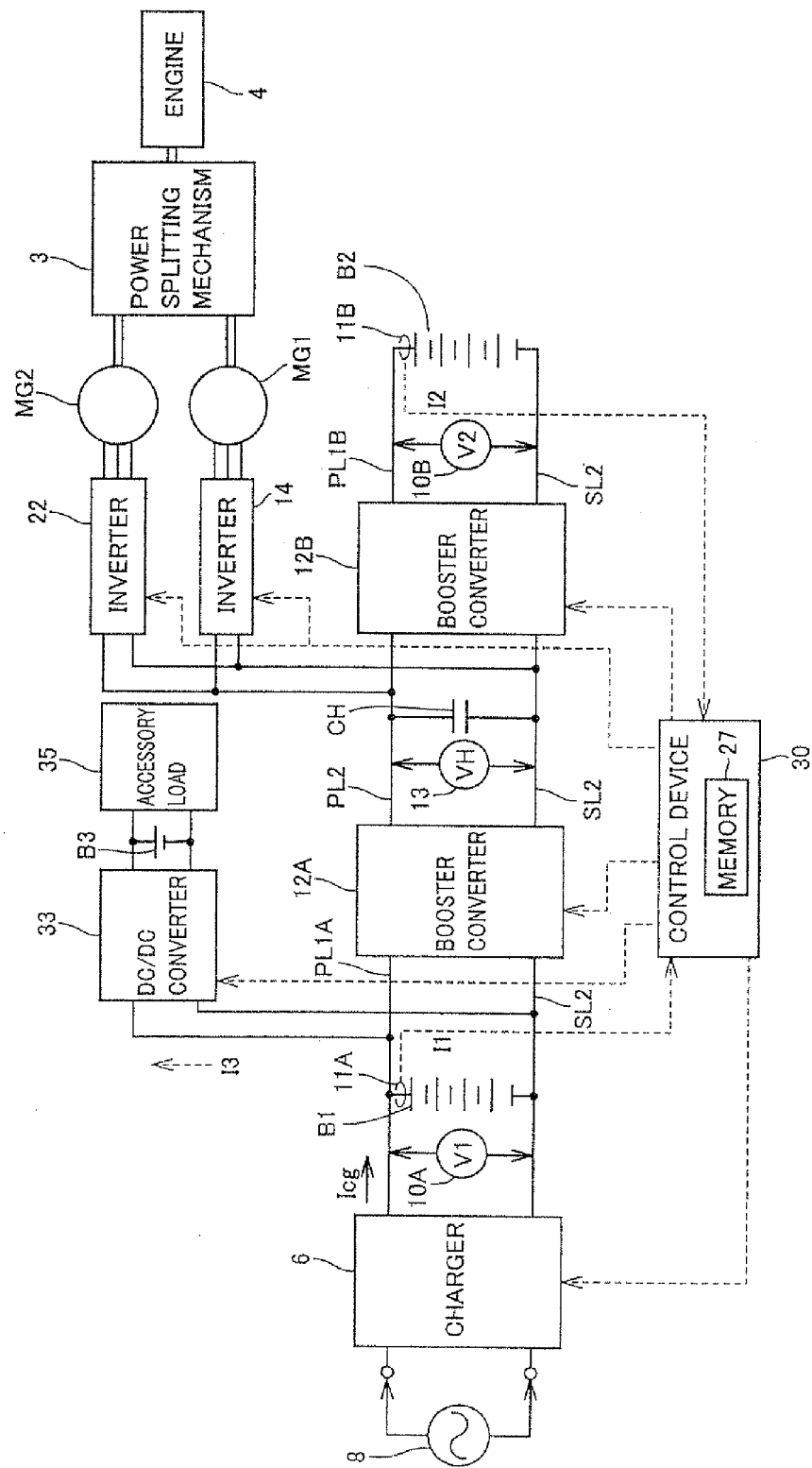
FIG. 1A shows a major structure of a vehicle 1 according to an embodiment of the invention.

FIG. 1A shows a major structure of a vehicle 1 according to an embodiment of the invention.

Referring to FIG. 1, vehicle 1 includes batteries B1 and B2 that are power storage devices, booster converters 12A and 12B that are electric power converting units, a smoothing capacitor CH, voltage sensors 10A, 10B and 13, inverters 14 and 22, an engine 4, motor generators MG1 and MG2, a power splitting mechanism 3 and a control device 30.

The power storage devices mounted on this vehicle can be externally charged. Therefore, vehicle 1 further includes a charger 6 located between a commercial power supply 8 of AC 100V, for example, and battery B1. Charger 6 converts an AC to a DC and regulates a voltage for applying it to the battery. For allowing external charging, the vehicle may employ a manner of connecting neutral points of stator coils of motor generators MG1 and MG2 to the AC power supply as well as a manner of combining booster converters 12A and 12B to operate them as a AC-DC converting device.

Smoothing capacitor CH smoothes the voltages boosted by booster converters 12A and 12B. Voltage sensor 13 senses a terminal voltage VH (i.e., voltage between terminals) of smoothing capacitor CH, and provides a sensed value to control device 30.

Inverter 14 converts DC voltage VH provided from booster converter 12B or 12A to a three-phase AC voltage, and provides it to motor generator MG1. Inverter 22 converts DC voltage VH provided from booster converter 12B or 12A to a three-phase AC voltage, and provides it to motor generator MG2.

Power splitting mechanism 3 is coupled to engine 4 and motor generators MG1 and MG2 for distributing a drive power among them. For example, power splitting mechanism 3 may be a planetary gear mechanism having three rotation shafts, i.e., a sun gear, a planetary carrier and a ring gear. In the planetary gear mechanism, when two of the three rotation shafts are determined, the rotation of the remaining one rotation shaft is inevitably determined. These three rotation shafts are connected to rotations shafts of engine 4 and motor generators MG1 and MG2, respectively. The rotation shaft of motor generator MG2 is coupled to wheels by reduction and differential gears (not shown). Power splitting mechanism 3 may further include internally a speed reducer for the rotation shaft of motor generator MG2.

Voltage sensor 10A measures a voltage V1 between terminals of battery B1. For monitoring a state of charge of battery B1 together with voltage sensor 10A, there is arranged a current sensor 11A that senses a current I1 flowing through battery B1. Also, control device 30 senses the state of charge SOC1 of battery B1. Control device 30 calculates the state of charge based on an open circuit voltage of battery B1 and an accumulation of current I1 flowing through battery B1. For example, battery B1 may be formed of a secondary battery such as a lead acid battery, a nickel hydrogen battery or a lithium-ion battery, or a large-capacity capacitor such as an electrical double layer capacitor.

Voltage sensor 10B measures a voltage V2 between terminals of battery B2. For monitoring the state of charge of battery B2 together with voltage sensor 10B, there is arranged a current sensor 11B that senses a current I2 flowing through battery B2. Control device 30 senses the state of charge SOC2 of battery B2. Control device 30 calculates the state of charge based on an open circuit voltage of battery B2 and an accumulation of current I2 flowing through battery B2. For example, battery B2 may be formed of a secondary battery such as a lead acid battery, a nickel hydrogen battery or a lithium-ion battery, or a large-capacity capacitor such as an electrical double layer capacitor.

Batteries B1 and B2 can be used, e.g., simultaneously with each other so that the storage-allowing capacities thereof are set to allow the output of an allowed maximum power to electric loads (inverter 22 and motor generator MG2) connected to the power supply line. Thereby, the running with the maximum power can be performed during the EV (Electric Vehicle) running that does not use the engine.

After the electric power of battery B2 is fully consumed, engine 4 can be used in addition to battery B1 so that the running with the maximum power can be performed without using battery B2.

Inverter 14 is connected to a power supply line PL2 and a ground line SL2. Inverter 14 receives the boosted voltage from booster converters 12A and 12B, and drives motor generator MG1, e.g., for cranking engine 4. Also, inverter 14 returns, to booster converters 12A and 12B, the power generated by motor generator MG1 that is driven by the drive power transmitted from engine 4. In this operation, control device 30 controls booster converters 12A and 12B to operate as voltage converting circuits that covert voltage VH to voltages VH1 and VH2, respectively.

Inverter 22 is connected, in parallel with inverter 14, to power supply line PL2 and ground line SL2. Inverter 22 converts the DC voltage provided from booster converters 12A and 12B to a three-phase AC voltage, and provides it to motor generator MG2 that drives the wheels. When regenerative braking is performed, inverter 22 returns the electric power that is generated by motor generator MG2 to booster converters 12A and 12B. In this operation, control device 30 controls booster converters 12A and 12B to operate as voltage converting circuits that convert voltage VH to voltages V1 and V2, respectively.

Control device 30 receives respective torque command values of motor generators MG1 and MG2 as well as motor current values, motor revolution speeds, values of voltages V1, V2 and VH, and start signals. Control device 30 provides a boost command, a step-down command and an operation-inhibiting command to booster converter 12B.

Further, control device 30 provides, to inverter 14, a drive command for converting the DC voltages that are outputs of booster converters 12A and 12B to the AC voltage used for driving motor generator MG1, and a regeneration command for converting the AC voltage generated by motor generator MG1 to the DC voltage and returning it toward booster converters 12A and 12B.

Likewise, control device 30 provides, to inverter 22, a drive command for converting the DC voltage to the AC voltage to be used for driving motor generator MG2, and a regeneration command for converting the AC voltage generated by motor generator MG2 to the DC voltage and returning it toward booster converters 12A and 12B.

Further, there are arranged an accessory battery B3 for driving an accessory load 35 as well as a DC/DC converter 33. Accessory load 35 includes, e.g., power supplies of various ECUs, headlights, room lamps, power windows, a horn and direction indicators. DC/DC converter 33 is connected to a power supply line PL1A and ground line SL2. In a charging operation, a charge current Icg is divided to supply a current I3 to DC/DC converter 33.

Figure 2:
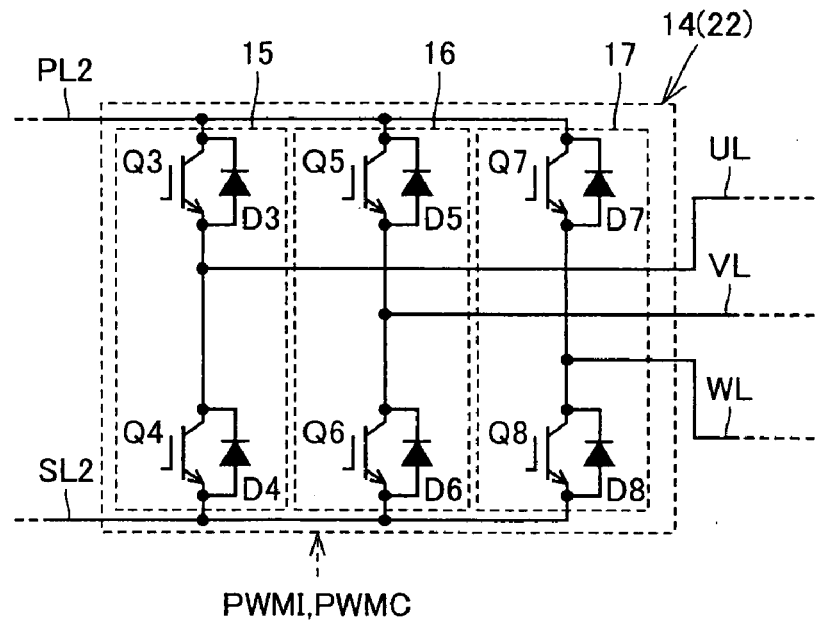
FIG. 2 is a circuit diagram showing specific structures of inverters 14 and 22 FIG. 1A.

FIG. 2 is a circuit diagram showing specific structures of inverters 14 and 22 in FIG. 1A.

Referring to FIGS. 1 and 2, inverter 14 includes U-, V- and W-phase arms 15, 16 and 17. U-, V- and W-phase arms 15, 16 and 17 are connected, in parallel with each other, between power supply line PL2 and ground line SL2.

U-phase arm 15 includes IGBT elements Q3 and Q4 that are connected in series between power supply line PL2 and ground line SL2, as well as diodes D3 and D4 that are connected in parallel to IGBT elements Q3 and Q4, respectively. Diode D3 has a cathode connected to a collector of IGBT element Q3 as well as an anode connected to an emitter of IGBT element Q3. Diode D4 has a cathode connected to a collector of IGBT element Q4 as well as an anode connected to an emitter of IGBT element Q4.

V-phase arm 16 includes IGBT elements Q5 and Q6 that are connected in series between power supply line PL2 and ground line SL2, as well as diodes D5 and D6 that are connected in parallel to IGBT elements Q5 and Q6, respectively. Diode D5 has a cathode connected to a collector of IGBT element Q5 as well as an anode connected to an emitter of IGBT element Q5. Diode D6 has a cathode connected to a collector of IGBT element Q6 as well as an anode connected to an emitter of IGBT element Q6.

W-phase arm 17 includes IGBT elements Q7 and Q8 that are connected in series between power supply line PL2 and ground line SL2, as well as diodes D7 and D8 that are connected in parallel to IGBT elements Q7 and Q8, respectively. Diode D7 has a cathode connected to a collector of IGBT element Q7 as well as an anode connected to an emitter of IGBT element Q7. Diode D8 has a cathode connected to a collector of IGBT element Q8 as well as an anode connected to an emitter of IGBT element Q8.

A midpoint of each phase arm is connected to an phase end of the phase coil in motor generator MG1. More specifically, motor generator MG1 is a three-phase permanent magnet synchronous motor, and one end of each of the three, i.e., U-, V- and W-phase coils is commonly connected to the neutral point. The other end of the U-phase coil is connected to a line UL extending from a connection node between IGBT elements Q3 and Q4. The other end of the V-phase coil is connected to a line VL extending from a connection node between IGBT elements Q5 and Q6. The other end of the W-phase coil is connected to a line WL extending from a connection node between IGBT elements Q7 and Q8.

Although inverter 22 in FIG. 1A is connected to motor generator MG2, inverter 22 has substantially the same internal circuit structure as inverter 14 so that description thereof is not repeated. FIG. 2 shows control signals PWMI and PWMC provided to the inverter, and these correspond to the drive command and the regeneration command.

Figure 3:
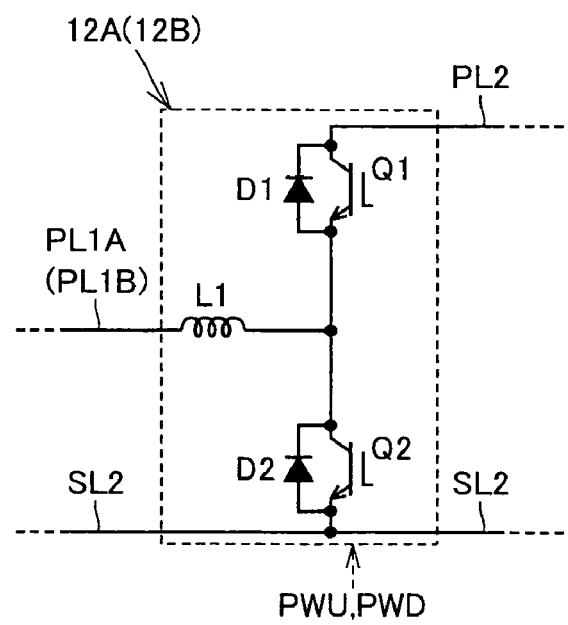
FIG. 3 is a circuit diagram showing specific structures of booster converters 12A and 12B in FIG. 1A.

FIG. 3 is a circuit diagram showing specific structures of booster converters 12A and 12B in FIG. 1A.

Referring to FIGS. 1 and 3, booster converter 12A includes a reactor L1 connected at its one end to power supply line PL1A, IGBT elements Q1 and Q2 connected in series between power supply line PL2 and ground line SL2, and diodes D1 and D2 connected in parallel to IGBT elements Q1 and Q2, respectively.

The other end of reactor L1 is connected to an emitter of IGBT element Q1 and a collector of IGBT element Q2. A cathode and an anode of diode D1 are connected to a collector and the emitter of IGBT element Q1, respectively. A cathode and an anode of diode D2 are connected to the collector and an anode of IGBT element Q2, respectively.

Booster converter 12B in FIG. 1A differs from booster converter 12A in that booster converter 12B is connected to a power supply line PL1B instead of power supply line PL1A, but has substantially the same internal structure as booster converter 12A so that description thereof is not repeated. Although FIG. 3 shows control signals PWU and PWD provided to the booster converter, these signals correspond to the boost command and the step-down command, respectively.

Figure 4:
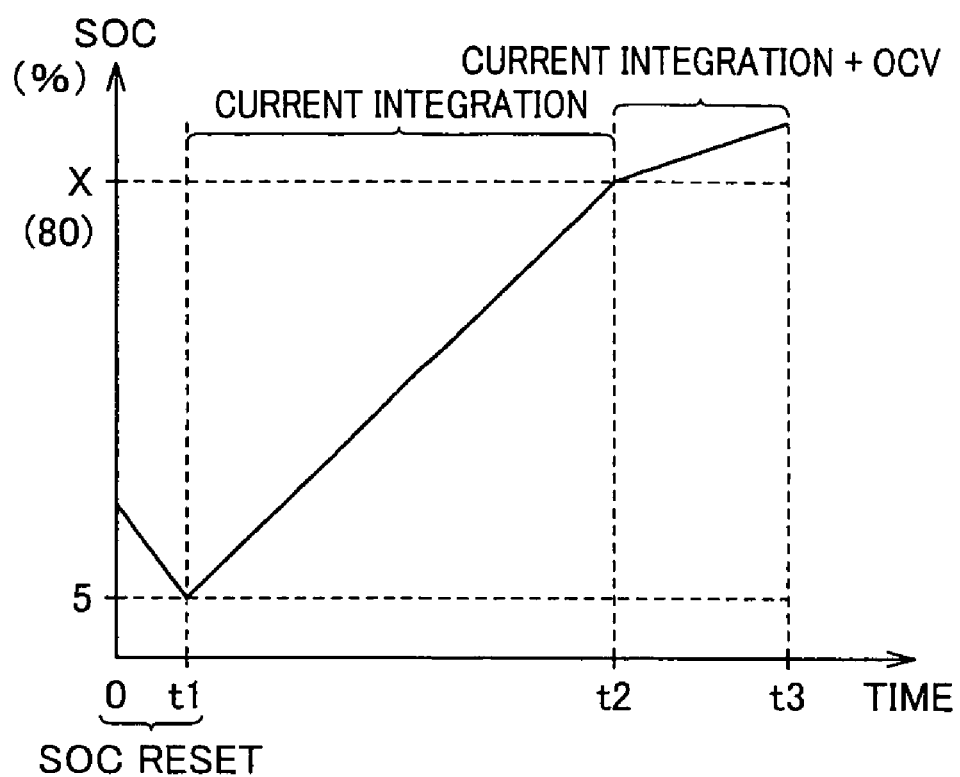
FIG. 4 schematically shows changes in state of charge SOC of a battery that is externally charged.

FIG. 4 schematically shows changes that occur in state of charge SOC when the battery is externally charged.

Referring to FIG. 4, when the external charging is to be performed, the battery is first discharged between times 0 and t1 so that the state of charge SOC lowers. When it is determined from the battery voltage that the state of charge SOC has sufficiently lowered, the SOC reset processing that will be described later in detail is executed at time t1. The SOC reset processing is performed to set the SOC in which an estimation error occurred during charge/discharge operation of the battery to a predetermined value (5% in FIG. 4).

At time t1, when the resetting of the SOC ends, the charging of the batteries starts. Between times t1 and t2, the SOC is estimated primarily based on current integrating processing. When the SOC exceeds X %, e.g., of 80%, the SOC is estimated based on the current integrating processing and an OCV (Open Circuit Voltage) of the battery. When the estimated value of the SOC reaches the upper limit value, the charging is completed.

For increasing an allowed distance of travel by the battery, it is important that the battery is charged to attain nearly the limit of the performance. For preventing the overcharge of the battery, it is important to estimate precisely the SOC. Therefore, it is important to employ a method that performs the SOC reset processing of canceling accumulation of errors and can estimate the SOC as precisely as possible in the subsequent charging operation.

Figure 5:
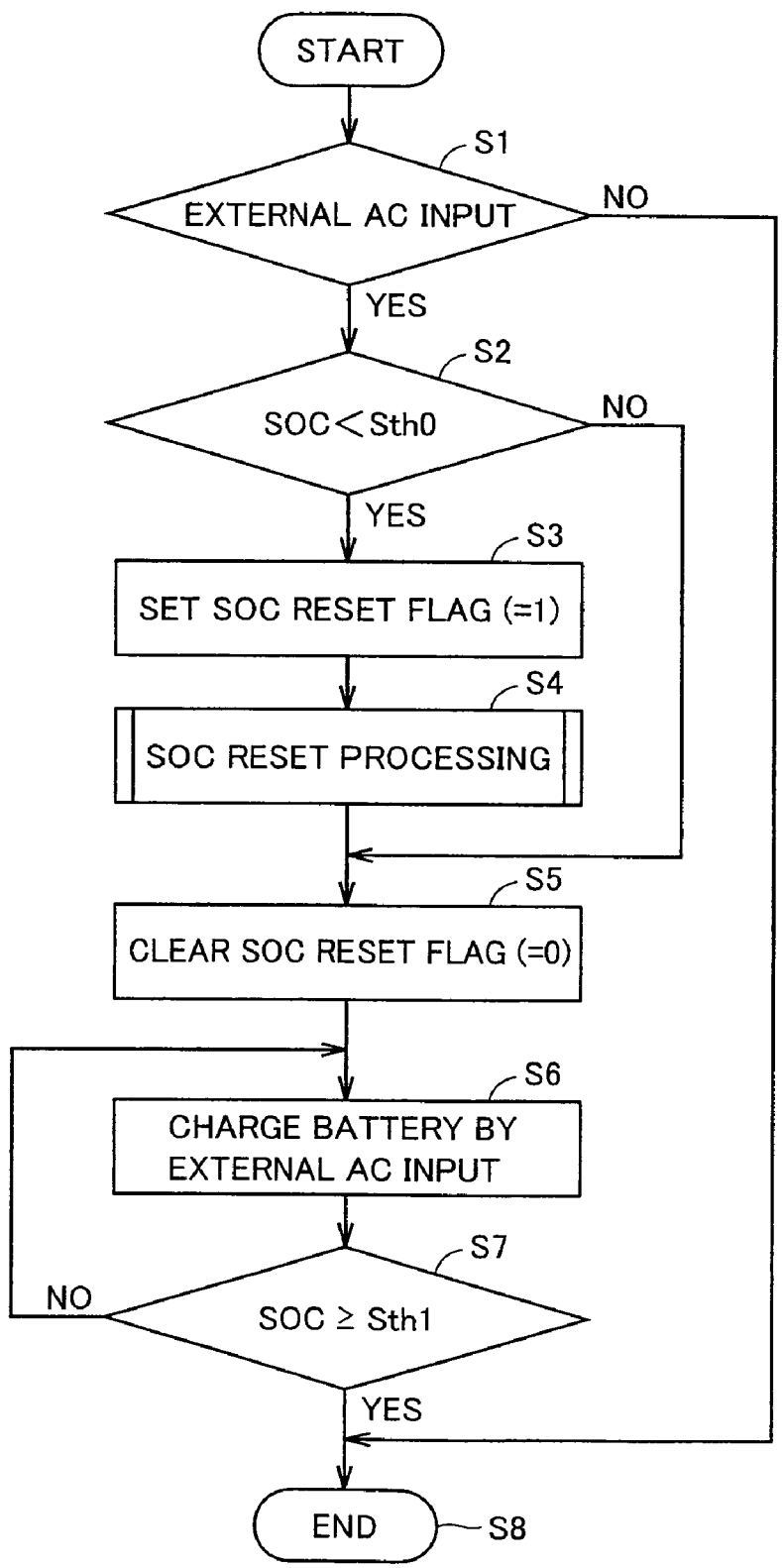
FIG. 5 is a flowchart showing a series of control performed by control device 30 in FIG. 1A during external charging.

FIG. 5 is a flowchart showing a series of control performed by control device 30 in FIG. 1A during the external charging.

Referring to FIGS. 1 and 5, when the processing in this flowchart starts, it is first determined in a step S1 whether there is input of the AC power supply from the outside of the vehicle or not. For example, a connector unit for connecting charger 6 to commercial power supply 8 may be provided with a voltage sensor, and the application of the AC voltage may be sensed thereby. Also, the connector unit may be provided with a sensing switch for sensing physical fitting of a charging plug, and the connection of the plug may be sensed thereby.

When there is no external AC input in step S1, the external charging is not performed so that the process proceeds to a step S8, and the process in this flowchart ends. When the external AC input is sensed in step S1, the process proceeds to a step S2.

In step S2, it is determined whether the SOC of battery B1 or B2 that is currently handled as a target of the external charging is smaller than a predetermined threshold Sth0 or not. This is determined for the following reason. For performing the SOC resetting, the battery must be discharged. However, when the discharge were performed from a nearly fully charged battery, a quantity of discharge would be excessively large and an energy loss would be large. Therefore, when a relationship of (SOC<Sth0) is not satisfied in step S2, the process skips the SOC reset processing in a step S4, and proceeds to a step S5. Conversely, when the relationship of (SOC<Sth0) is satisfied, the process proceeds to a step S3, in which an SOC reset flag is set to 1, and the SOC reset processing is executed in step S4.

In FIG. 5, the SOC reset processing is performed only when the SOC is low in step S2. However, the process may be configured to perform always the SOC reset in step S4 during the external charging operation without executing step S2.

Figure 6:
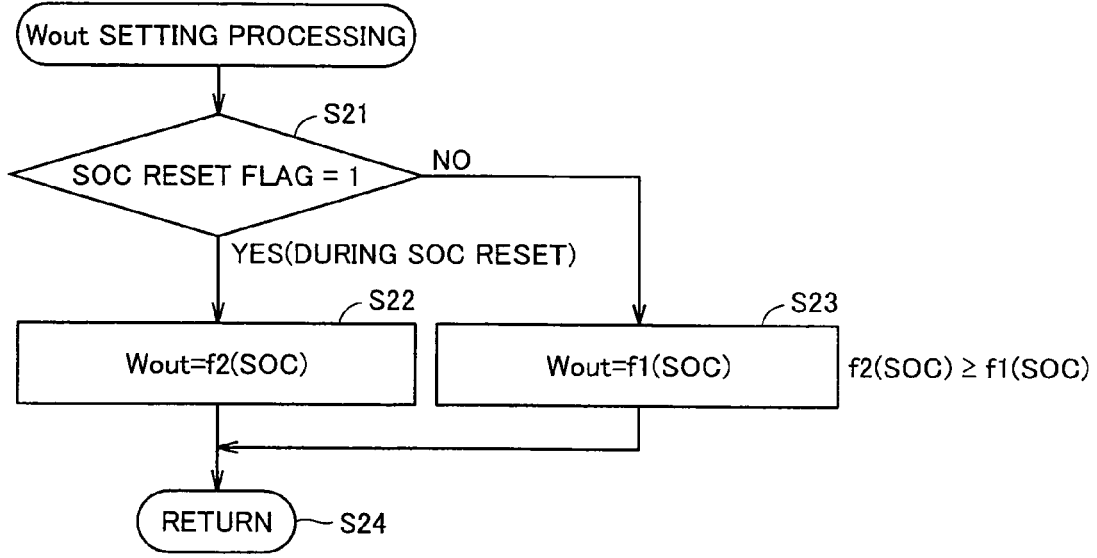
FIG. 6 is a flowchart for illustrating processing of switching a limit value Wout of a discharge power related to SOC reset processing.

FIG. 6 is a flowchart for illustrating processing of switching a limit value Wout of the discharge power related to the SOC reset processing.

The processing in the flowchart of FIG. 6 is periodically executed for determining limit value Wout of the power that can be discharged from the battery of the charge/discharge target. When the quantity of discharge from the battery exceeding limit value Wout is required, control is performed in the vehicle to suppress the actual quantity of discharge to limit value Wout.

First, it is determined in a step S21 whether the SOC reset flag is set to 1 or not. The SOC reset flag is configured to be set to 1 in step S3 in FIG. 5, and to be cleared to 0 in step S5, and is stored, e.g., in a predetermined region of a memory 27 in FIG. 1A. When the SOC reset flag that is read with reference to memory 27 takes a value of 1 in step S21, the process proceeds to a step S22. Otherwise, the process proceeds to a step S23.

Figure 7:
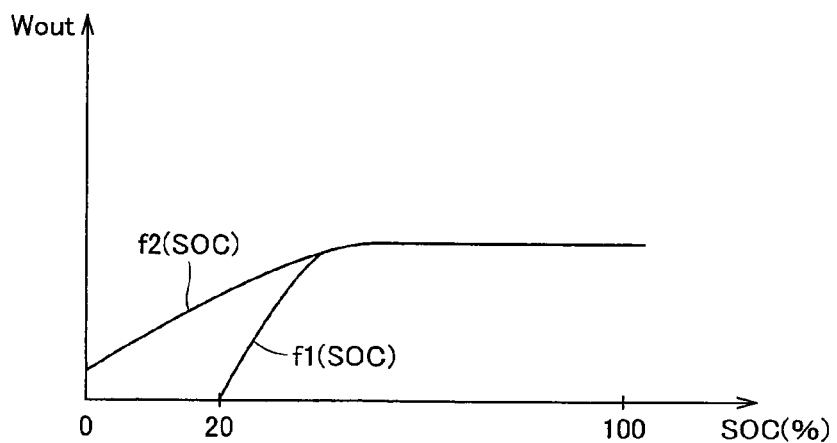
FIG. 7 shows an example of a map which is referred to in a step S22 or S23 in FIG. 6.

FIG. 7 shows an example of the map to which reference is made in step S22 or S23 in FIG. 6.

In a step S22 in FIG. 6 (when the SOC is reset), limit value Wout is determined with reference to a map f2(SOC) in FIG. 7. Conversely, in a step S23 in FIG. 6 (i.e., when running is performed), limit value Wout is determined with reference to a map f1(SOC) in FIG. 7. Thus, limit value Wout corresponding to the currently estimated value of the SOC is determined with reference to the map in FIG. 7.

The map is configured such that a relationship of (f2(SOC) ≧f1(SOC)) is satisfied in a region of the low SOC. Therefore, limit value Wout (i.e., f2(SOC)) that is set in the SOC reset operation suppresses the quantity of power to a lower extent that limit value Wout (i.e., f1(SOC)) that is set in the vehicle running operation or the like.

As shown in FIG. 7, map f1(SOC) that is set in the running operation or the like defines Wout as 0 (Wout=0) when the SOC is smaller than 20%, and thus inhibits the discharging from the battery. This is because the management is performed in view of the efficiency, battery life and the like so that the SOC may not become lower than the management lower limit value (e.g., of 20%) in the running operation or the like.

Conversely, map f2(SOC) that is set in the SOC reset operation during the external charging operation allows the further discharging even when the SOC is equal to or lower than the management lower limit value, e.g., of 20%. This is because the SOC reset lowers the SOC to about 5%, and therefore the execution would be impossible if Wout were set using map f1(SOC). Even when SOC is equal to 0, map f2(SOC) sets Wout larger than 0 (Wout>0) for the following reason. The SOC is an estimated value, and therefore may negatively deviate from a true value. Therefore, the above relationship of (Wout>0) is set so that the true value of the SOC can be set to a predetermined value, e.g., of 5% by allowing the discharging even when the estimated SOC value is negative.

When the setting of limit value Wout ends in step S22 or S23, the control moves to a main routine in a step S24.

A diagnosis routine may be incorporated into the routine for diagnosing a state as being abnormal when the SOC becomes lower than the lower limit value. In this case, the following processing may be added. When the SOC reset flag is set to 1, limit value Wout is switched as shown in the flowchart of FIG. 6 and the abnormality-diagnosing routine is disabled. When the SOC reset flag is cleared to 0, the abnormality-diagnosing routine is enabled again.

When the SOC reset flag is set to 1 in step S3 in FIG. 5, step S22 in FIG. 6 is executed, and limit value Wout is set by map f2(SOC). Then, the SOC reset processing in step S4 is performed.

Figure 8:
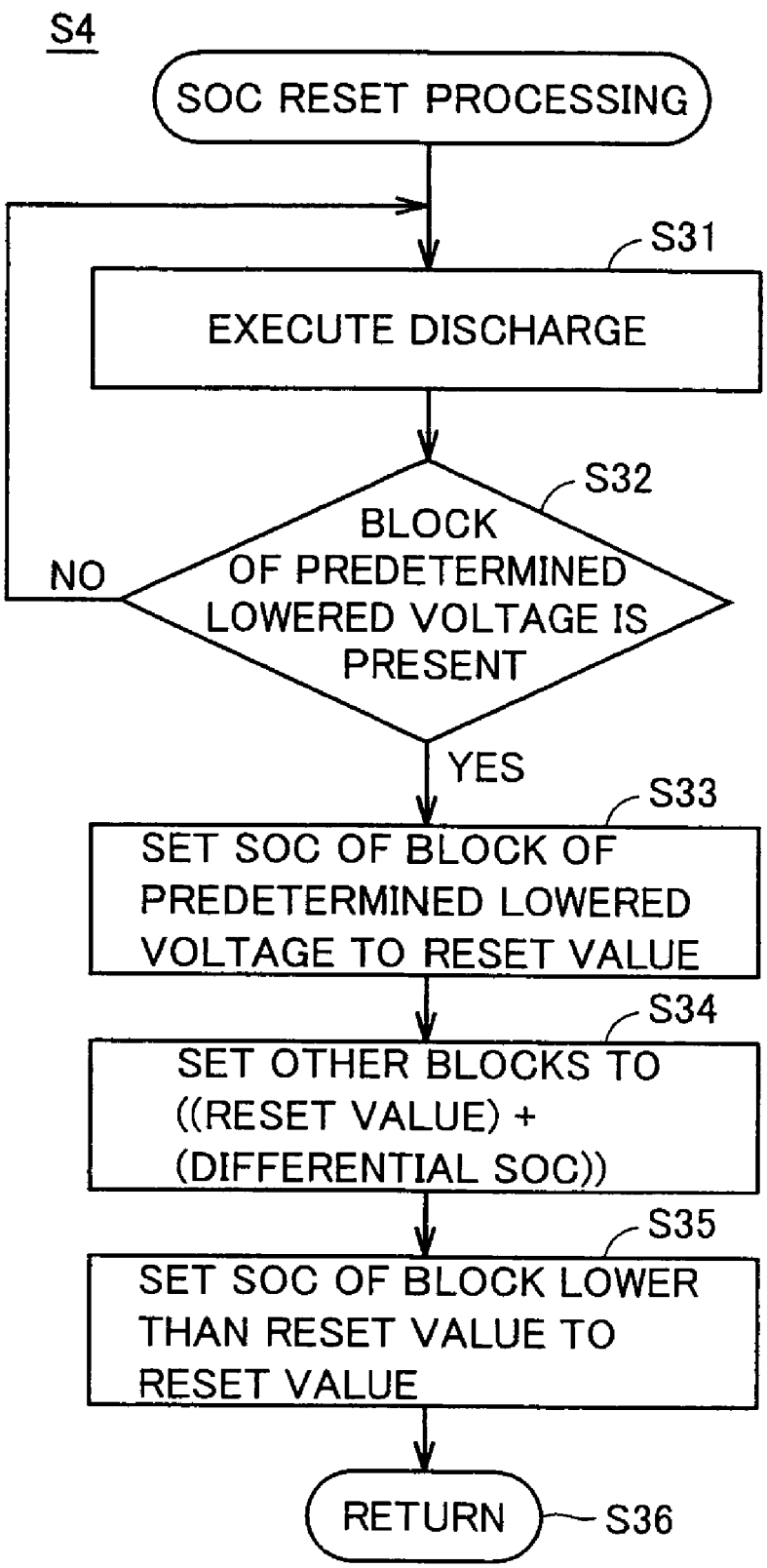
FIG. 8 is a flowchart for specifically illustrating the SOC reset processing in a step S4 in FIG. 5.

FIG. 8 is a flowchart for specifically illustrating the SOC reset processing in step S4 in FIG. 5.

Referring to FIG. 8, processing is first performed in a step S31 to execute the discharging from the battery that is the SOC reset target. This discharging may be performed from either one or both of batteries B1 and B2.

The discharging method is not particularly restricted. However, the discharging of batteries B1 and B2 may be performed by charging accessory battery B3, or may be performed by passing a current not generating a torque to the stator coils in motor generators MG1 and MG2.

Subsequently, it is determined in step S32 whether there is a block of a voltage lowered to a predetermined voltage or not.

Figure 9:
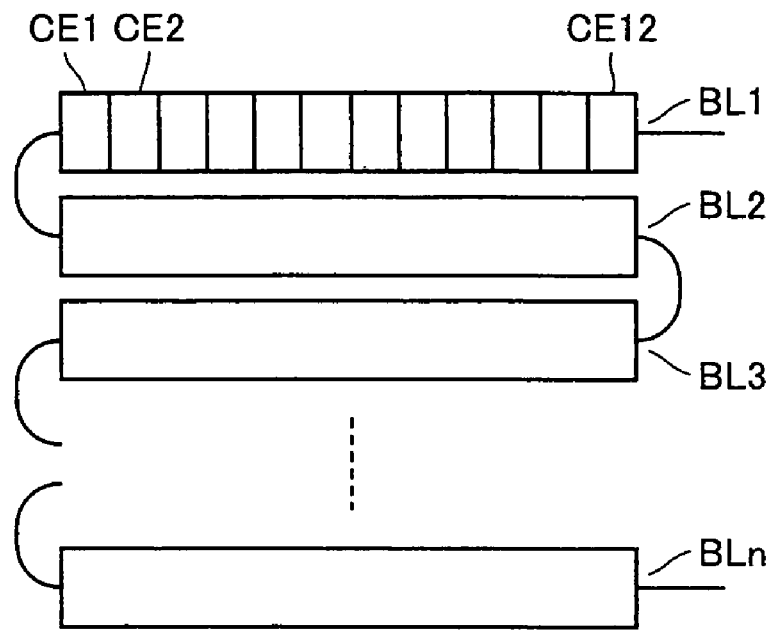
FIG. 9 shows an example of a structure of the battery.

FIG. 9 shows an example of a structure of the battery.

Each of batteries B1 and B2 includes blocks BL1-BLn connected in series as shown in FIG. 9, and each block includes cells CE1-CE12 connected in series. Although not shown, a battery voltage of each of blocks BL1-BLn is measured, and the SOC of each battery is estimated. Since blocks BL1-BLn are connected in series, it is required to measure the current at one position on them.

Figure 10:
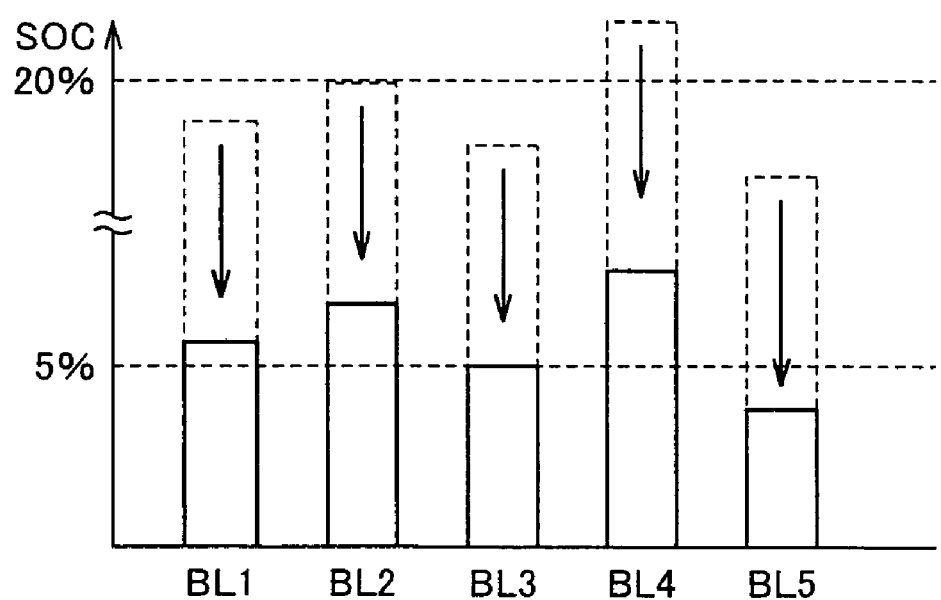
FIG. 10 illustrates a change in SOC of each block of the battery during discharging.

FIG. 10 illustrates changes in SOC of each block in the battery during the discharging.

For the sake of illustration, FIG. 10 representatively shows blocks BL1-BL5. When the discharging takes place in step S31 in FIG. 8, the SOC of each block lowers below the management lower limit value, e.g., of 20% of the SOC in the ordinary running operation. Batteries BL1-BL5 connected in series ideally have the SOCs equal to each other, but certain differences occur between these SOCs due to manufacturing variations of the battery blocks, variations in degree of deterioration and differences in estimation error.

Figure 11:
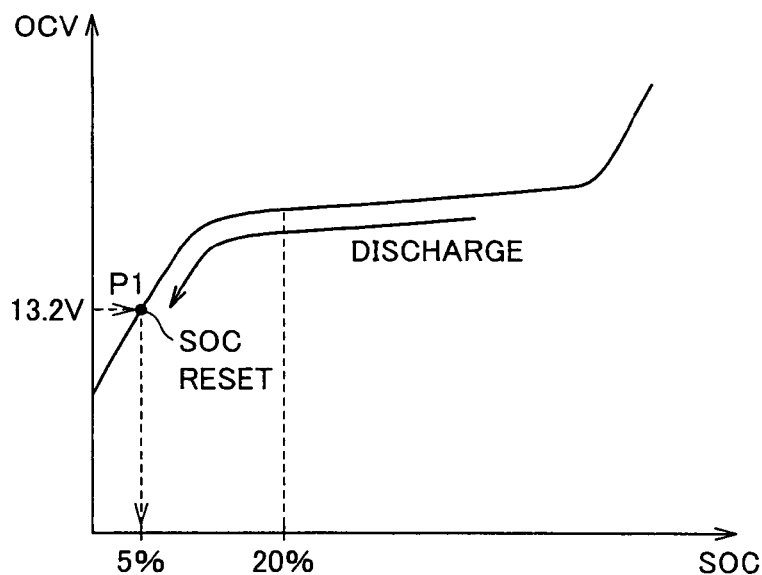
FIG. 11 illustrates a principle of SOC reset.

FIG. 11 illustrates a principle of the SOC reset.

Referring to FIG. 11, in the SOC reset operation, the battery is discharged to lower the SOC to a predetermined value, e.g., of 5% lower than the management lower limit value in the ordinary running operation. Remarkable variations do not appear in open circuit voltage OCV of each block of the battery when the SOC is close to the management lower limit value, e.g., of 20%. Therefore, the error may increase when the SOC close to 20% is estimated again based on the OCV.

When the discharge progresses and the SOC reaches a value close to a point P1 of a predetermined value, e.g., of 5%, open circuit voltage OCV changes largely with change in SOC. At point P1, such a relationship is satisfied that the OCV is equal, e.g., to 13.2V when the SOC is 5%. Therefore, at or around point P1, the SOC can be reset accurately based on open circuit voltage OCV.

Accordingly, the battery is discharged until the OCV reaches 13.2V. When the OCV reaches 13.2V, the process no longer uses the SOC that has been estimated based on the current integration until this time, and sets the SOC to 5% (i.e., reset).

The OCV can be obtained from the following equation (1) where V represents a measured voltage between the positive and negative terminals of the block, I represents a current and R (fixed value) represents an internal resistance value of the block.

$$OCV = V - RI \qquad (1)$$

In step S32 in FIG. 8, the OCV is calculated for each block, and it is determined whether there is a block of which OCV has lowered to the predetermined value, or not. It is assumed that open circuit voltage OCV of block BL3 first reaches 13.2V as a result of the progress of the discharging. In this state, if no error were present in the estimated value of the SOC of block BL3, the SOC would be 5% as shown in FIG. 10. When the SOC is not 5%, it can be considered that the SOC other than 5% is due to accumulation of errors caused by the estimation.

Accordingly, in step S33 in FIG. 8, the SOC is set to the reset value, e.g., of 5% in the block of which OCV obtained in the equation (1) has lowered to a predetermined voltage, e.g., of 13.2%. In a step S34, a sum of the reset value and a differential value is set in the other blocks so that the other blocks keep the differential value of the estimated SOC value with respect to the block of which SOC is set to the reset value.

For example, it is assumed that the estimated SOC value is 8% when the OCV of block BL3 reaches 13.2V. At the same time, it is assumed that block BL4 has the OCV higher than 13.2V, and the estimated SOC value thereof is 12%. In this case, the differential value between the estimated SOC values of blocks BL3 and BL4 is 4% (=12%−8%). When the SOC of block BL3 is reset to 5%, the SOC of block BL4 is simultaneously set to 9% equal to a sum of the differential value of 4% and the reset value.

Since the SOC is the estimated value, the differential value may be negative. For example, as shown in FIG. 10, when the OCV of block BL3 reaches 13.2V, the estimated SOC of block BL5 may be lower than the SOC of block BL3 in spite of the fact that the OCV of block BL5 obtained by the equation (1) is higher than 13.2 V. In this case, it can be considered from the relationship between the OCVs that the SOC of block BL5 lower than that of BL3 is an error, and this error is due to accumulation of the estimation errors. Therefore, the SOC of block BL5 is likewise set to the reset value of 5% in a step S35. This reduces the error in SOC.

In the case where the other blocks likewise have the SOCs close to the reset value that causes large changes in OCV, and these SOCs can be set according to the OCVs, the practical relationship between the OCV and SOC near the reset value may be mapped more finely, and the SOCs of the blocks other than block BL3 may be set to values corresponding to the OCVs when block BL3 is set to the reset value.

When the processing in step S35 ends, the SOC reset processing is completed in step S36, and the control moves to the flowchart of FIG. 5.

In the flowchart of FIG. 5, when the SOC reset processing in step S4 is completed, the process proceeds to step S5. A SOC reset flag that was set to 1 during the SOC reset processing is cleared to 0 in step S5. Thereby, Wout is set in step S23 in FIG. 6 according to map f1(SOC) prepared for the ordinary operation.

Subsequently to step S5, the battery is charged by the external AC input in a step S6. During the charging, the SOC of each block of the battery is being estimated. In a step S7, it is determined whether the estimated SOC of any block has reached a charge target value Sth1 or not.

In step S7, when the SOC has not reached target value Sth1, the process returns to step S6, and the external charging continues. Conversely, when the SOC of any block has reached target value Sth1 in step S7, the process proceeds to step S8, in which the external charging stops and the charging is completed.

The external charging in steps S6 and S7 is executed under conditions that are different in some points form those during the vehicle running. It is therefore preferable to change the SOC estimation processing for charging the battery as close to an upper limit value as possible while ensuring an intended accuracy of the SOC.

Figure 12:
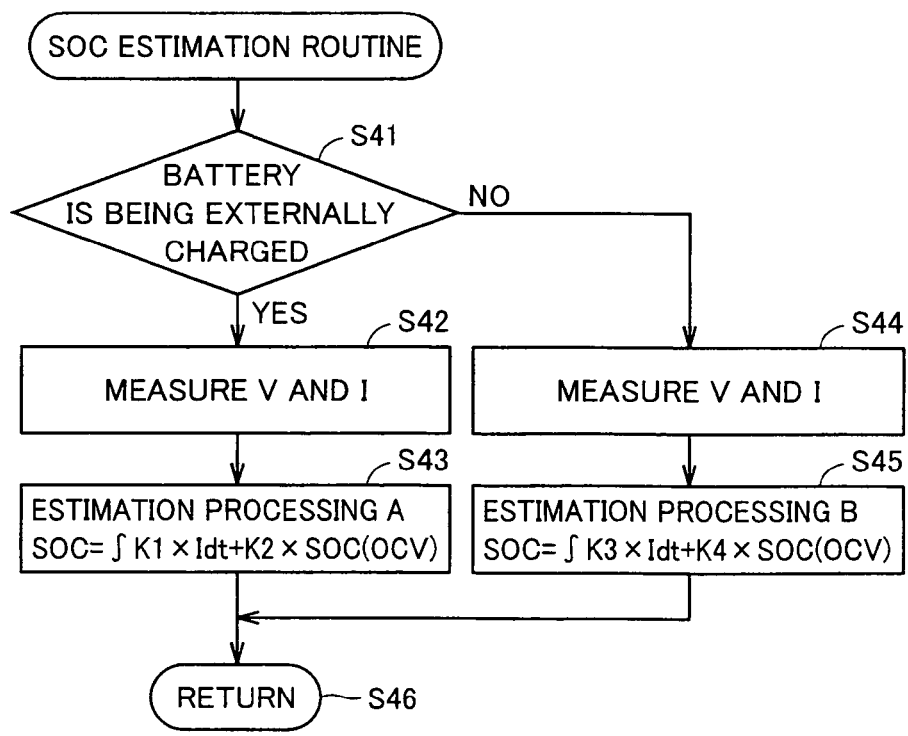
FIG. 12 is a flowchart for illustrating SOC estimation processing.

FIG. 12 is a flowchart for illustrating the SOC estimation processing. Control device 30 in FIG. 1A executes the processing of this flowchart at predetermined intervals or every time predetermined conditions are satisfied. For example, the control device in FIG. 1A may be implemented by some ECUs (Electronic Control Units). More specifically, the SOC estimation processing shown in FIG. 12 may be executed by a battery ECU employed for managing the batteries, and may be configured to transmit the estimated SOC to another ECU controlling the inverters and booster converters.

Referring to FIG. 12, it is first determined in a step S41 whether the battery is being externally charged or not. Differences between the state where the external charging is being performed and the other cases are as follows. (1) When the external charging is being performed, the foregoing SOC reset is already performed so that it can be expected that the estimation error is already reset and the estimation accuracy of the SOC is high. (2) During the running, the charge current and the discharge current vary depending on the running pattern (e.g., acceleration, request for braking and inclined road surface), but the charge current can be controlled to be substantially constant during the external charging in contrast to the above case so that the estimation error is unlikely to occur during the external charging. (3) In contrast to the running operation, when the external charging is performed, only the charging takes place and the discharging does not take place after the SOC reset, and it is not necessary to guard against the overcharge.

Accordingly, using effectively the above differences between conditions, the SOC estimation with higher accuracy is performed during the external charging. When the external charging is being performed in step S41, the process proceeds to step S42. After battery voltage V and battery current I are measured, estimation processing A is executed in a step S43. On the other hand, when the external charging is not being performed in step S41, the process proceeds to a step S44. After battery voltage V and battery current I are measured, estimation processing B is executed in a step S45.

After the estimating processing is executed in step S43 or S45, the process proceeds to step S46, and the estimated SOC is transferred to the main routine or another ECU for use therein.

Figure 13:
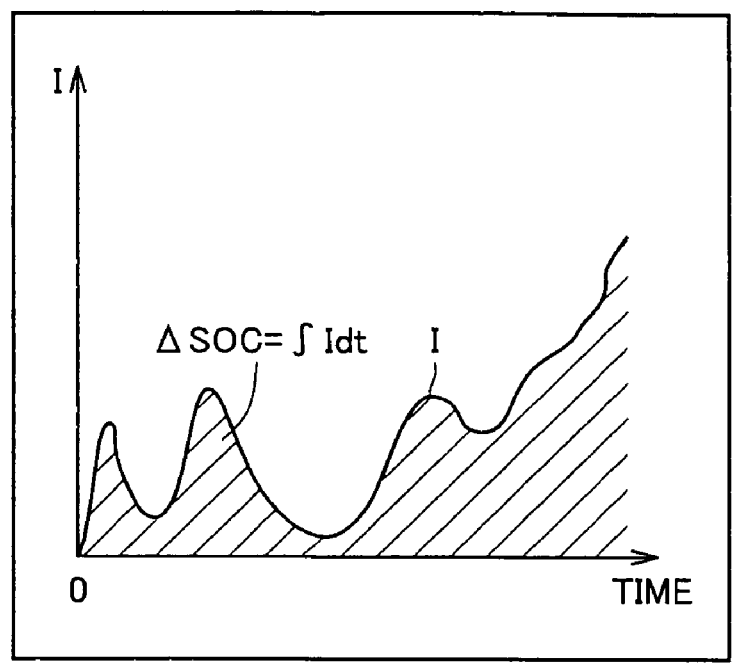
FIG. 13 illustrates processing of integrating a current in estimation processing A.

FIG. 13 illustrates processing of integrating the current in estimation processing A.

Figure 14:
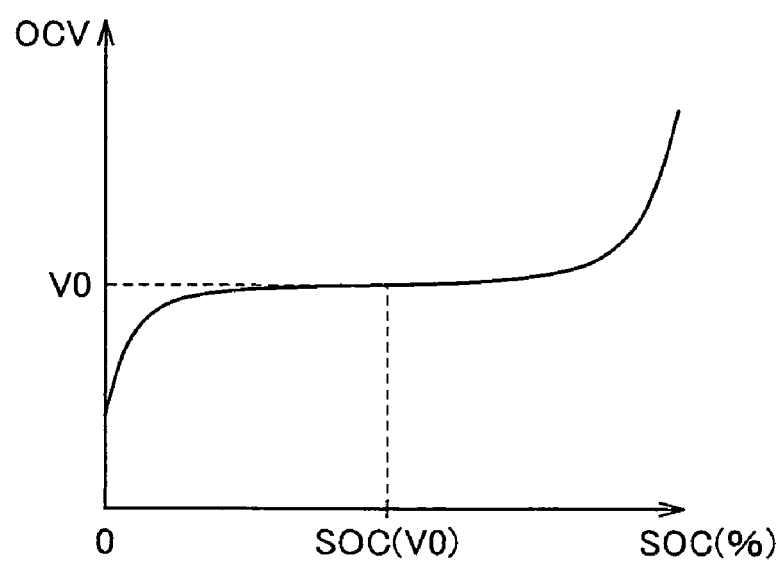
FIG. 14 illustrates estimation of the SOC from an open circuit voltage OCV in estimation processing A.

FIG. 14 illustrates estimation of the SOC from open circuit voltage OCV in estimation processing A.

Figure 15:
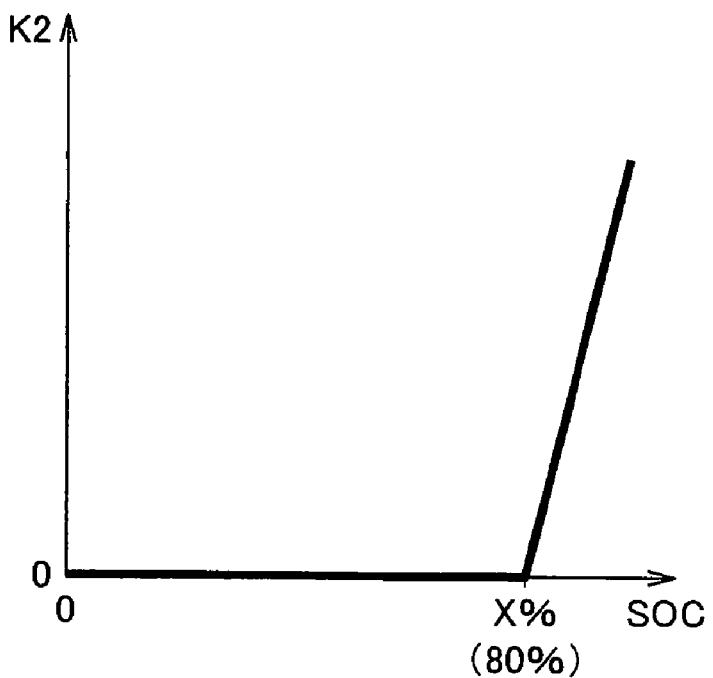
FIG. 15 shows an example of a weighting coefficient K2 in estimation processing A.

FIG. 15 shows an example of a weighting coefficient K2 in estimation processing A.

Estimation processing A executed in step S43 in FIG. 12 uses the integrated current value and open circuit voltage OCV as represented by the following equation (2):

$$SOC = \int K1 \times I dt + K2 \times SOC(OCV) \quad (2)$$

The integrated current value is used for obtaining a variation quantity ΔSOC of the SOC from the integrated value of current I that flows to/from the battery. As shown in FIG. 13, an area determined by measured current value I on the graph before the current point of time becomes integrated value $\int I dt$. A product of this value and charge efficiency K1 becomes the first term of the right side of the equation (2).

In the right side of the equation (2), K2 of the second term is the weighting coefficient, and SOC(OCV) is the SOC corresponding to open circuit voltage OCV and is defined on the map as shown in FIG. 14. For example, when open voltage is V0, the corresponding SOC is read as SOC(V0) from the map.

As can be seen from FIG. 14, the OCV changes largely with changes in SOC when the SOC is in a region near 0% or 100%. However, the OCV does not change largely with changes in SOC when the SOC is substantially in a central flat region in FIG. 14. In this region, therefore, a large and thus serious error occurs when the SOC is estimated from the OCV.

Therefore, weighting coefficient K2 shown in FIG. 15 is reflected in the estimated SOC by multiplying the SOC (OCV) obtained from the map in FIG. 14 by weighting coefficient K2. When the SOC is between 0% and X% (e.g., 80%), coefficient K2 is set, e.g., to 0. Coefficient K2 may take a sufficiently small value other than 0 provided it does not reflect the OCV in the SOC. Therefore, while the SOC is between 0% and X % (e.g., 80%), the SOC is estimated primarily from the current integration in FIG. 13 without substantially reflecting the SOC obtained from open circuit voltage OCV in FIG. 14.

When the SOC exceeds X %, e.g., of 80%, weighting coefficient K2 is increased to reflect the SOC obtained from open circuit voltage OCV in the estimation. For example, even in the case where the estimated value is smaller than the actual SOC due to the error in SOC estimation based on the current integration, the OCV increases largely in the region near 100%, and therefore the estimated value of the SOC increases corresponding to it so that the estimated SOC reaches the charge-stop threshold, and the charging can be stopped. Therefore, in the region near the fully charged state, such a situation is prevented that the estimated SOC is smaller than the actual SOC, and it is possible to prevent the overcharge of the battery due to the practical SOC exceeding the upper limit value.

Figure 16:
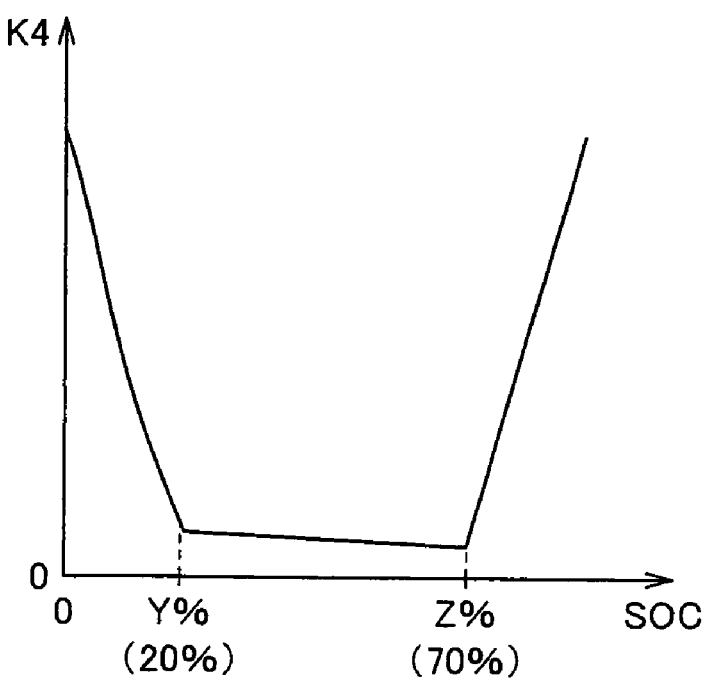
FIG. 16 shows an example of a weighting coefficient K4 in estimation processing B.

FIG. 16 shows an example of a weighting coefficient K4 in estimation processing B.

Estimation processing B executed in step S45 in FIG. 12 uses the integrated current value and open circuit voltage OCV in the following equation (3).

$$SOC = \int K3 \times I dt + K4 \times SOC(OCV) \quad (3)$$

The first term in the right side of the equation (3) is a product of integrated current value $\int I dt$ and a charge coefficient K3. K4 of the second term in the right side of the equation (2) is a weighting coefficient, and the SOC(OCV) is defined on a map shown in FIG. 16.

As can be seen from FIG. 14, however, when the SOC is in a region near 0% or 100%, the OCV changes largely with change in SOC. However, the OCV does not change largely with change in SOC when the SOC is in a central flat region of FIG. 14. Therefore, a large estimation error may occur when the SOC is estimated from the OCV in the central region.

Therefore, weighting coefficient K4 shown in FIG. 16 is reflected in the estimated SOC by multiplying the SOC (OCV) obtained in FIG. 14 by coefficient K4. Therefore, when the SOC is between Y % and Z % (e.g., 20% and 70%), the SOC obtained from open circuit voltage OCV in FIG. 14 is hardly reflected, and the SOC is estimated by the current integration in FIG. 13.

When the SOC exceeds Z %, e.g., of 70%, weighting coefficient K4 is increased to reflect the SOC obtained from open circuit voltage OCV. For example, even when the obtained estimation value is smaller than the actual SOC due to an error that occurs in SOC estimation based on the current integration, the OCV increases on the side near 100% and thereby the SOC increases corresponding to it according to the equation (3). Therefore, the estimated SOC value reaches the charge-stop threshold, and the charging can be stopped. Therefore, such a situation can be prevented that the estimated SOC value is smaller than the actual SOC in a region near the fully charged state, and such a situation can be prevented that the actual SOC exceeds the upper limit value and the battery is overcharged.

In estimation processing B, the discharging must be taken into consideration. Accordingly, when the SOC becomes lower than Y %, e.g., of 20%, weighting coefficient K4 is increased for reflecting the SOC obtained from open circuit voltage OCV. For example, even when the estimated value is larger than the actual SOC due to the error that occurs in SOC estimation based on the current integration, the OCV decreases in a region near 0% and therefore the SOC decreases corresponding to it according to the equation (3). Therefore, the estimated SOC value reaches the discharge-stop threshold, and the discharge can be stopped. Therefore, such a situation can be prevented that the estimated SOC value is larger than the actual SOC in the region near the lower limit of the SOC management value, and such a situation can be prevented that the actual SOC becomes lower than the lower limit value and the battery is overdischarged.

As a result of the above estimation processing A, the SOC is estimated as shown in FIG. 4 when the external charging is executed. Between times 0 and t1 in FIG. 4, the battery is first discharged to execute the SOC reset processing. Thereafter, the charging of the battery starts, and the SOC is estimated primarily based on the current integrating processing between times t1 and t2. When the SOC exceeds X %, e.g., of 80%, the SOC is estimated based on the current integrating processing and open circuit voltage OCV of the battery.

Figure 17:
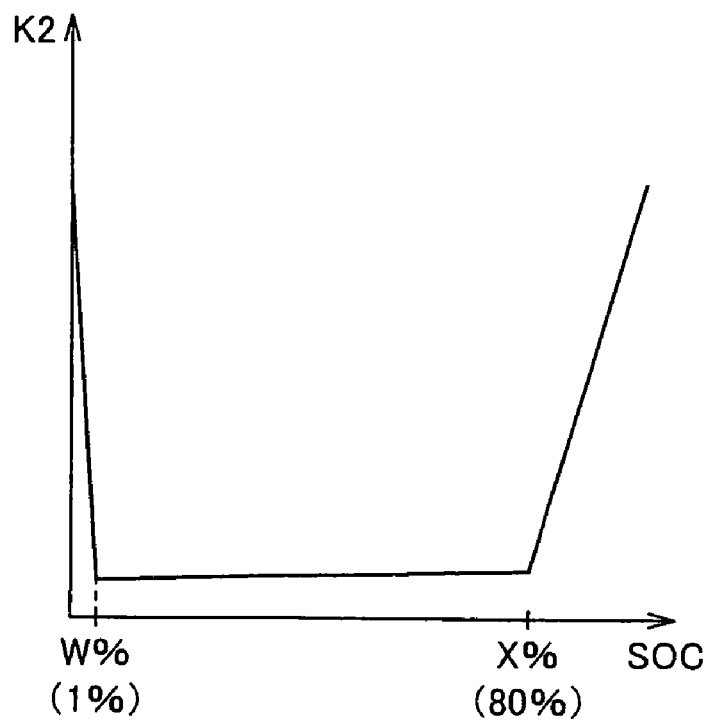
FIG. 17 shows a modification of coefficient K2 shown in FIG. 15.

FIG. 17 shows a modification of coefficient K2 shown in FIG. 15.

As shown in FIG. 17, estimation processing A may likewise be configured to increase coefficient K2 in the region where the SOC is equal to or lower than W %, e.g., of 1% close to 0%. In this case, it is desired that the relationship between FIGS. 16 and 17 satisfies (W<Y) and (Z<X).

Figure 1B:
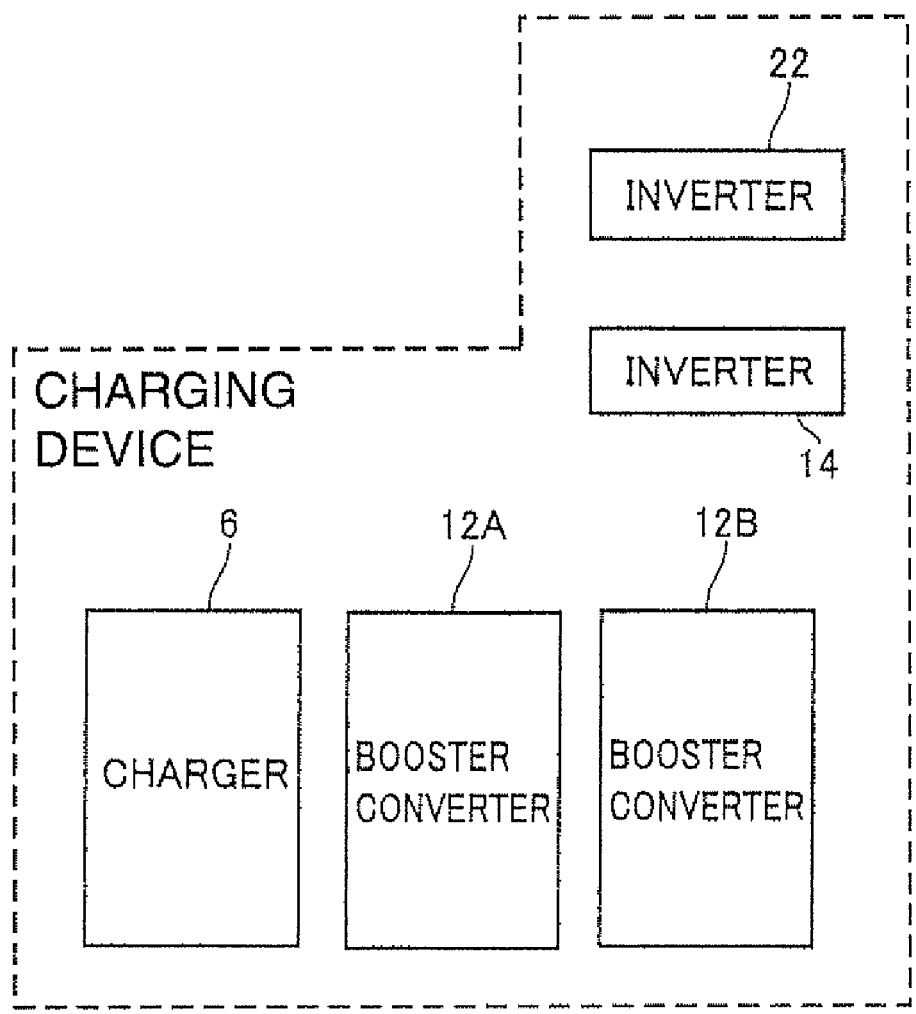
FIG. 1B shows components of a charging device.

The first embodiment already described can also be summarized as follows with reference to FIG. 1A. The vehicle power supply device in the first embodiment includes the power storage device (battery B1 or 132), the charging device, as illustrated in FIG. 1B, (charger 6, booster converters 12A and 12B, and inverters 14 and 22) capable of performing the internal charging operation for charging the power storage device with the electric power generated by the power generator (motor generator MG1 or MG2) inside the vehicle as well as the external charging operation for charging the power storage device by coupling to power supply 8 outside the vehicle, and the control device (30) for sensing the state of charge of the power storage device and controlling the charging device. The control device executes first estimation processing of estimating the state of charge of the power storage device when the internal charging operation is being performed in the charging device, and second estimation processing of estimating the state of charge of the power storage device when the external charging operation is being performed on the charging device.

Preferably, the power generator (MG1) inside the vehicle generates the electric power by receiving the drive power from the internal combustion engine (engine 4) inside the vehicle, and the charging device executes the internal charging operation for converging the state of charge of the power storage device to the target value during running of the vehicle.

Preferably, the power generator (MG2) inside the vehicle performs the regenerative operation during wheel braking, and the charging device executes the internal charging operation during running of the vehicle.

Preferably, as shown in FIG. 5, the control device executes the reset operation (S4) of discharging the power storage device and setting the state of charge of the power storage device to the predetermined state prior to the external charging operation (S6 and S7) when the execution of the external charging operation is selected.

More preferably, as shown in FIG. 7, the vehicle power supply device further includes the map defining the relationship between the upper limit value of the discharge power of the power storage device and the state of charge of the power storage device. The map includes a first map (f1(SOC)) being referred to during the vehicle running and the second map (f2(SOC)) being referred to during execution of the reset operation and being configured such that the upper limit value of the discharge power of the second map on the lower limit side of the state of charge is relaxed as compared with that of the first map.

Preferably, the vehicle power supply device further includes the current sensing unit (11A and 11B) for sensing the current flowing into the power storage device, and the voltage sensing unit (10A and 10B) for sensing the voltage of the power storage device. As shown in FIG. 12, in the first estimation processing (S43), the sum of the value obtained by multiplying, by the predetermined weighting coefficient (K2), the result of the first calculation of estimating the state of charge by integrating the current sensed by the current sensing unit and the value obtained by multiplying, by the predetermined weighting coefficient (K2), the result of the second calculation of estimating the state of charge based on the voltage sensed by the voltage sensing unit is obtained. In the second estimation processing (S45), the sum of the results of the first calculation and the second calculations multiplied by the weighting coefficient (K4) different from the coefficient used in the first estimation unit is obtained.

In the first embodiment, since the SOC estimation processing is performed as described above, the accuracy of the SOC is improved. Therefore, the external charging can be performed to an extent close to the upper limit of the battery performance, and the allowed distance of travel by the electric power of the battery can be increased.

Second Embodiment

The first embodiment uses open circuit voltage OCV of the battery as the parameter for estimating the SOC.

Figure 18:
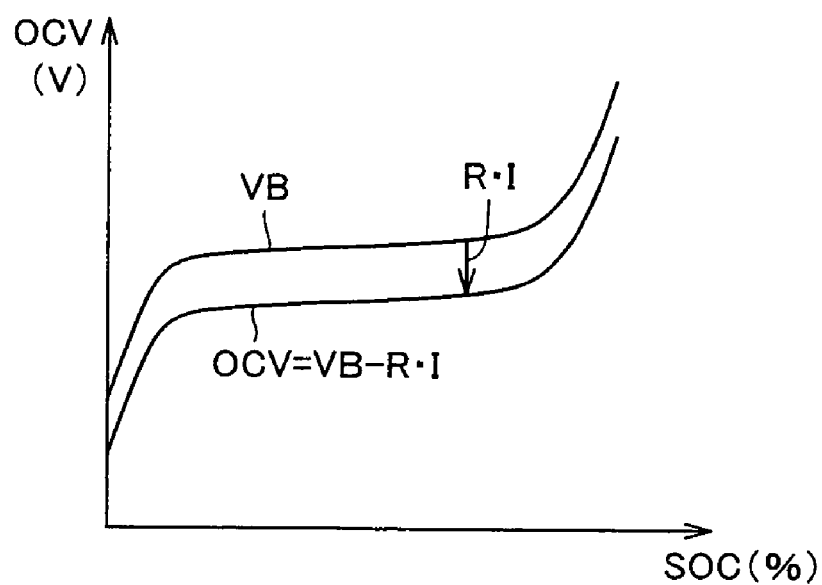
FIG. 18 illustrates a relationship between a battery voltage VB and open circuit voltage OCV.

FIG. 18 illustrates a relationship between a battery voltage VB and open circuit voltage OCV.

Referring to FIG. 18, when the battery is being charged, open circuit voltage OCV cannot be directly measured due to the influence of the internal resistance of the battery. Therefore, the OCV is calculated based on the equation of (OCV=VB−RI), where VB indicates the terminal voltage of the battery, R indicates the internal resistance of the battery and I indicates the battery current.

The calculated OCV is input to the map (which will be referred to as an "OCV map" hereinafter) shown in FIG. 14, and thereby the corresponding SOC is obtained. However, the OCV map changes moment by moment due to deterioration, memory effect and the like of the battery. Therefore, for estimating the SOC more accurately, it is preferable to renew the OCV map according to the present characteristics of the battery.

In the second embodiment, attention is focused on the fact that when the external charging is being executed, the charging is performed with a constant current and the accuracy of the SOC estimation can be higher than that in the normal running operation. Thereby, the OCV map is updated during the external charging.

Figure 19:
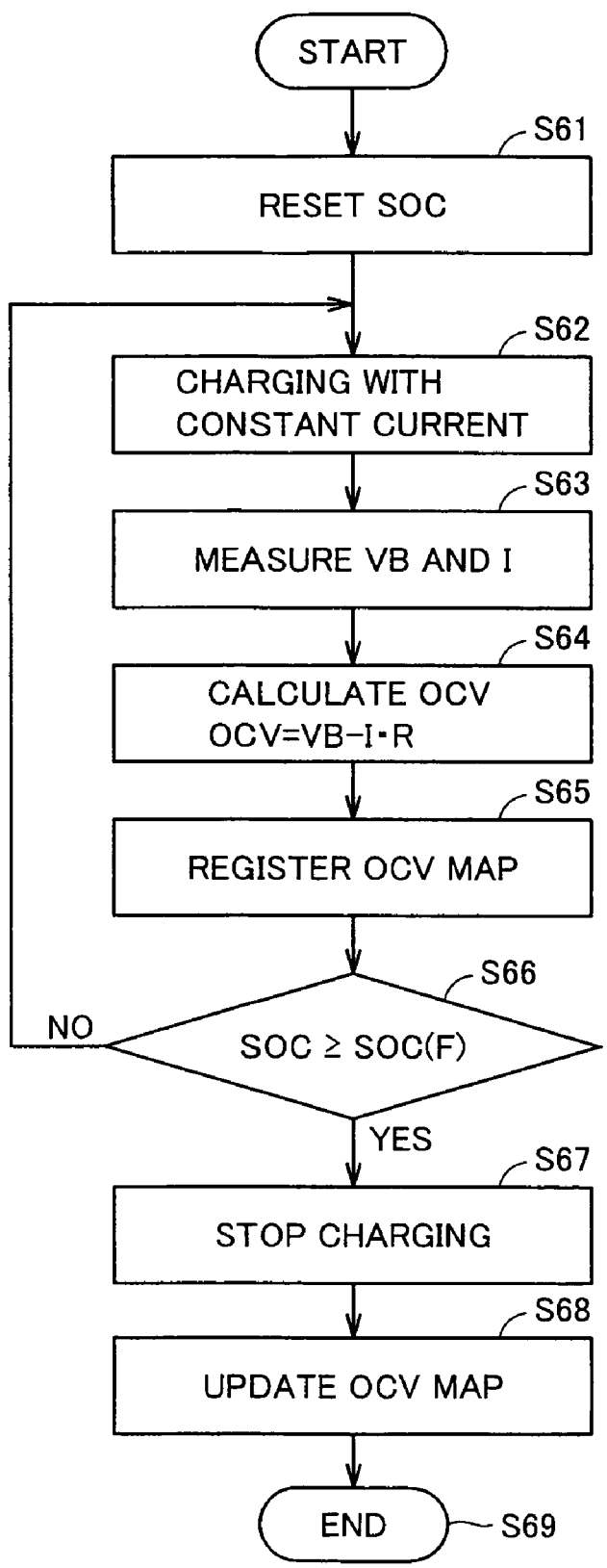
FIG. 19 is a flowchart illustrating processing of creating an OCV map executed in a second embodiment.

FIG. 19 is a flowchart illustrating processing of creating the OCV map executed in the second embodiment.

Referring to FIG. 19, the SOC reset is first performed in a step S61. The SOC reset is already described with reference to the flowchart of FIG. 8, and therefore description thereof is not repeated.

When the SOC reset in step S61 ends, the external charging with a constant current is performed in a step S62, and battery voltage VB and battery current I are measured in a step S63. In a step S64, open circuit voltage OCV is calculated based on the equation of (OCV=VB−IR).

Subsequently, the OCV map is registered in a step S65. When the external charging is executed, the SOC is obtained primarily by the current integration until the SOC reaches about 80% after the start, as already described with reference to FIG. 7 of the first embodiment. Memory 27 stores this correspondence between the SOC and the calculated OCV. In a step S66, it is determined whether the SOC reaches a predetermined threshold SOC(F) or more, or not. Threshold SOC(F) is a value corresponding to the target state of charge in which the charging is completed.

In step S66, when the SOC has not reached threshold SOC(F), the process returns to step S62, and the processing in steps S62-S65 are executed again. When (SOC≧SOC(F)) is satisfied in step S66, the process proceeds to a step S67. In step S67, the charging stops. At this point in time, memory 27 has stored a new map that represents the relationship between the SOC and the OCV conforming to the present state (states of deterioration, memory effect and others) of the battery. The map exhibits high accuracy because it is prepared by stably performing the constant current charging after resetting the SOC to cancel the errors already accumulated.

In a step S68, the OCV map to be subsequently referred to is updated, and the processing ends in a step S69.

Modification of the Second Embodiment

For updating the OCV map, the OCV may be obtained by another method.

Figure 20:
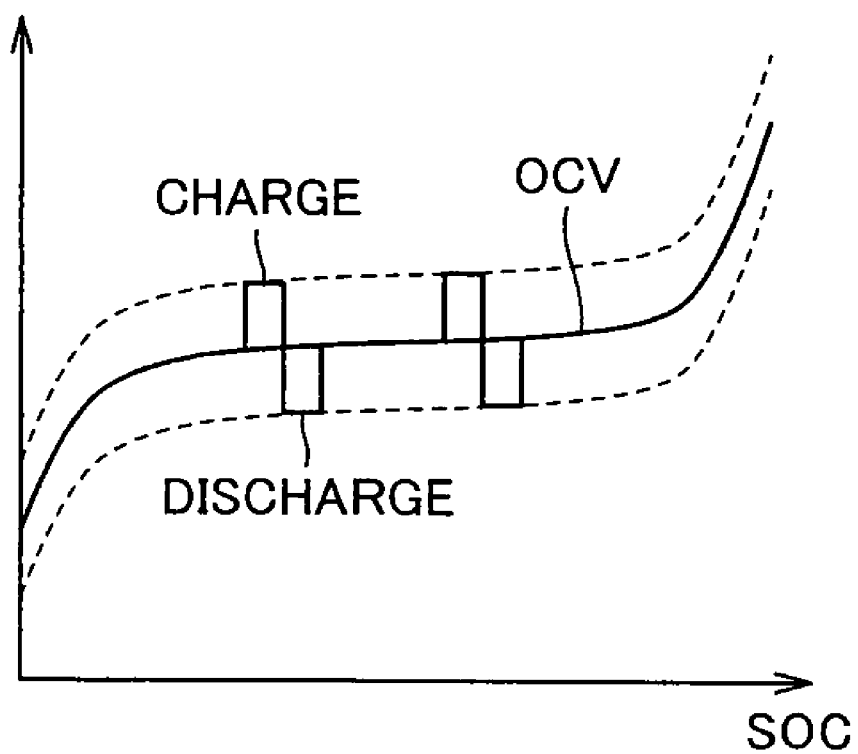
FIG. 20 illustrates a relationship between the OCV and charge/discharge of a battery current.

FIG. 20 illustrates a relationship between the OCV and the charge/discharge of the battery current.

Referring to FIG. 20, when a current does not flow to/from the battery, the terminal voltage of the battery is OCV. When the current flows to the battery for charging it, it is observed that the terminal voltage of the battery increases by a voltage RI equal to a product of internal resistance R and charge current I. Conversely, when the battery is discharged, it is observed that the terminal voltage decreases by voltage RI.

Accordingly, the battery is discharged for a short time with the current of the same magnitude as the charge current. Thereby, the exactly intermediate point between the battery voltage during the charging and the battery voltage during the discharging becomes OCV.

In the charging operation, a discharge pulse of a certain time (of 3, 5 or 10 seconds) is applied, whereby the OCV can be observed while performing the charging.

Figure 21:
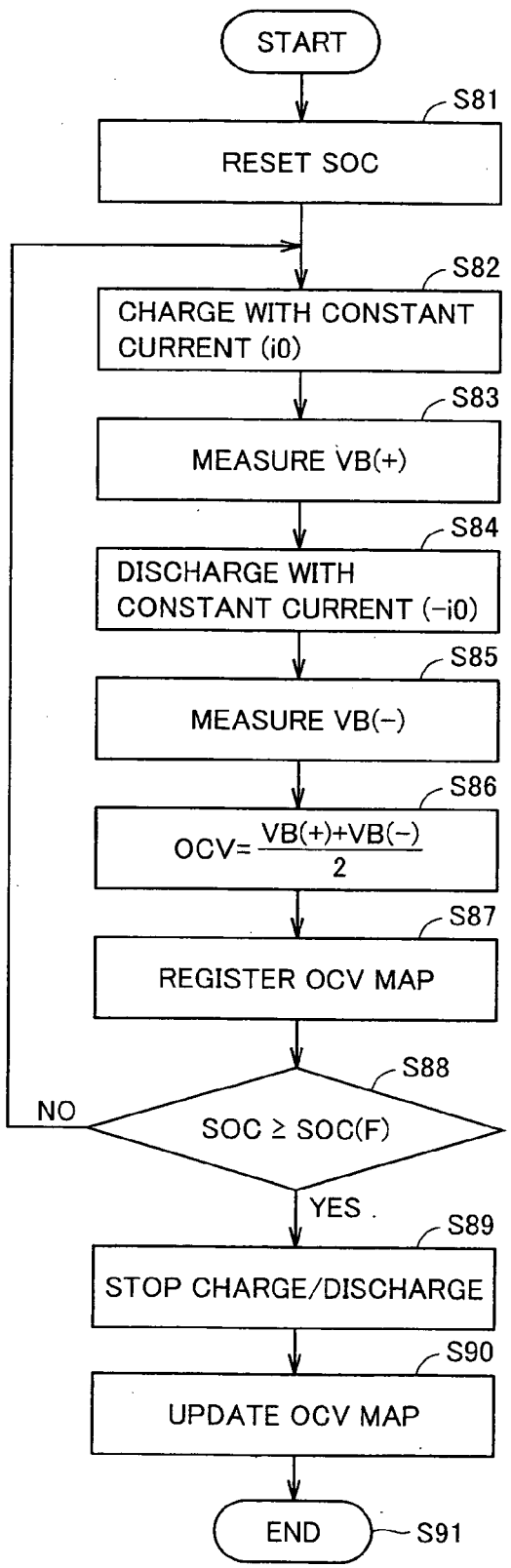
FIG. 21 is a flowchart illustrating processing of creating the OCV map executed in a modification of the second embodiment.

FIG. 21 is a flowchart illustrating processing of creating the OCV map executed in a modification of the second embodiment.

Referring to FIG. 21, the SOC reset is first executed in a step S81, and then the constant current charging with a current i0 is executed in a step S82. In a step S83, a battery voltage VB(+) is measured. In a subsequent step S84, the discharge pulse of a constant time (from 3 to 10 seconds) is applied. A current −i0 during the discharging has the same magnitude as a current +i0 that flows during the charging, and differs therefrom in direction. In a step S85, battery voltage VB(−) during the discharging is measured.

Figure 22:
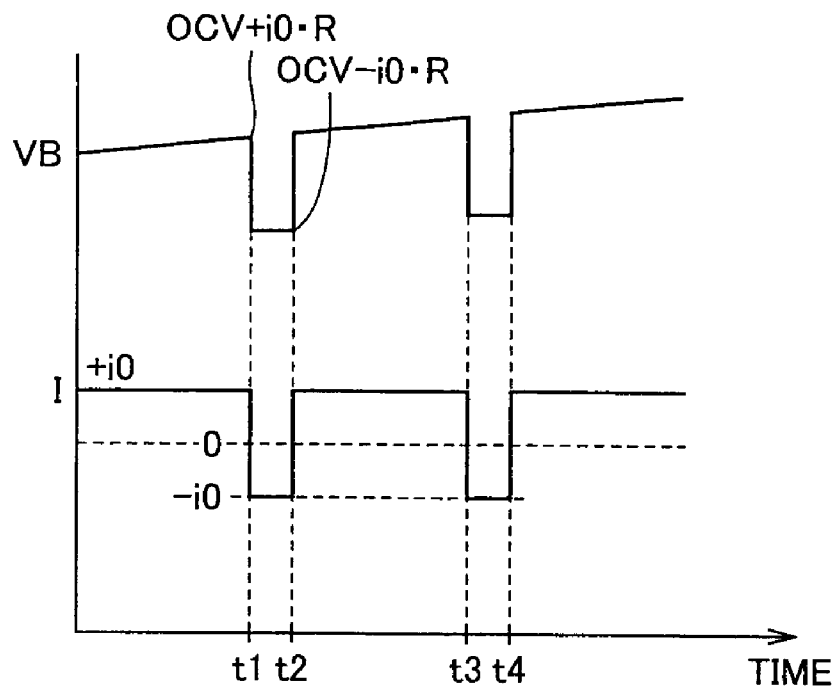
FIG. 22 is a waveform diagram for illustrating a state of repeating charging and discharging.

FIG. 22 is a waveform diagram for illustrating a state of repeating the charging and discharging.

Referring to FIGS. 21 and 22, the charging in step S82 is performed with charge current +i0 until time t1. Immediately before time t1, voltage VB(+) is measured in step S83. This voltage VB(+) is (OCV+i0·R), where R represents the internal resistance of the battery.

Between times t1 and t2, the discharging is executed in step S84. The discharge current is set to −i0. Immediately before time t2, battery voltage VB(−) is measured in step S85. This voltage VB(−) is (OCV −i0·R).

In a subsequent step S86, the OCV is obtained by the calculation of ((VB(+)+VB(−))/2). According to this method, even when the internal resistance of the battery changes due to deterioration or the like, the OCV can be obtained accurately.

In a step S87, the data of the OCV map is registered. When the external charging is executed, the SOC is obtained primarily by the current integration until the SOC reaches about 80% after the start, as already described with reference to FIG. 7 of the first embodiment. Memory 27 stores this correspondence between the SOC and the calculated OCV. In a step S88, it is determined whether the SOC reaches predetermined threshold SOC(F) or more, or not. Threshold SOC(F) is a value corresponding to the target state of charge in which the charging is completed.

In step S88, when the SOC has not reached threshold SOC(F), the process returns to step S82, and the processing in steps S82-S87 will be executed again. When (SOC≧SOC(F)) is satisfied in step S88, the process proceeds to a step S89. In step S89, the charging stops. At this point in time, memory 27 has stored a new map that represents the relationship between the SOC and the OCV conforming to the present state (states of deterioration, memory effect and others) of the battery. The map exhibits high accuracy because it is prepared by performing the constant current charging after resetting the SOC, and is not affected by variations in internal resistance R.

In a step S90, the OCV map that will be referred to in next processing is updated, and the processing ends in a step S91.

Processing of sensing changes in internal resistance may be performed in addition to the charge/discharge processing illustrating in FIGS. 21 and 22.

Figure 23:
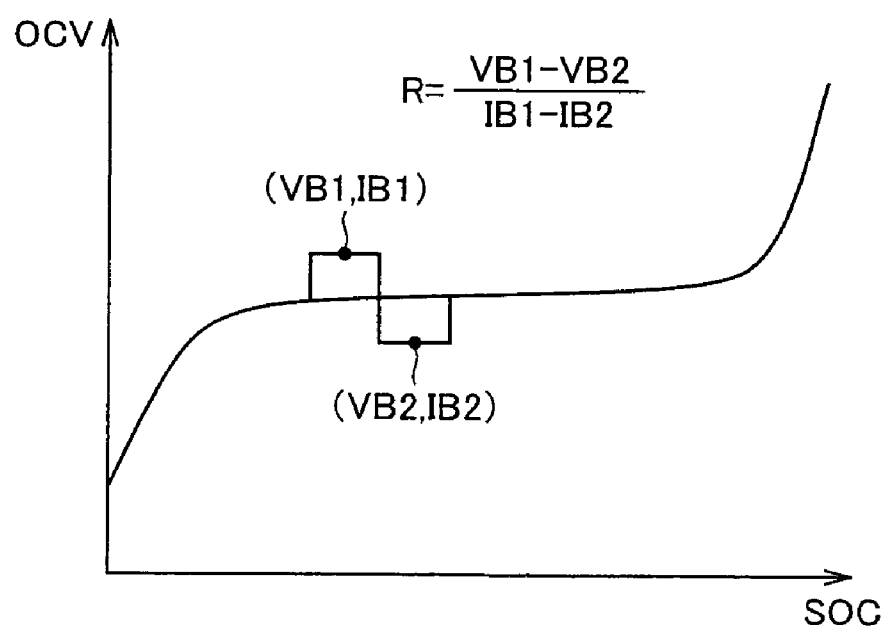
FIG. 23 illustrates a manner of estimating an internal resistance R.

FIG. 23 illustrates a manner of estimating internal resistance R.

Referring to FIG. 23, it is assumed that a battery terminal voltage VB1 and a charge current IB1 (IB1>0) are present at the time of charging, and a battery terminal voltage VB2 and a charge current IB2 (IB1<0) are present at the time of discharging immediately after the above charging. In this case, internal resistance R can be obtained from the following equation (4):

$$R=(VB1-VB2)/(IB1-IB2) \qquad (4)$$

As described above, when the external charging is performed, the sensing of internal resistance R is performed together with the calculation in step S86 in FIG. 21. When the charge/discharge with the value shown in FIG. 22 is performed, R becomes equal to (VB(+)−VB(−))/(i0×2). The operation for obtaining internal resistance R may be performed only once during the charging, and also may be performed every time the processing in step S86 is performed. When it is performed every the processing in step S86 is performed, it is possible to prepare the map representing the relationship between the SOC and internal resistance R.

Latest internal resistance R thus obtained can be used in the case where open circuit voltage OCV is to be obtained by adding or subtracting the product of internal resistance R and charge/discharge current I to or from battery voltage VB for estimating the SOC during the running.

The embodiments have been described in connection with the case where each embodiment is applied to the hybrid vehicle shown in FIG. 1A.

For example, the vehicle in FIG. 1, is equipped with two batteries B1 and B2, and the control may be configured to perform the external charging on only one of batteries B1 and B2, or to perform the external charging on both batteries B1 and B2. For example, constant voltage control of booster converter 12A is performed to keep voltage VH constant, and constant current control of booster converter 12B is performed to keep current I2 constant. By appropriately adjusting current I2, only one of batteries B1 and B2 may be charged with charge current Icg supplied from charger 6, or both the batteries may be equally charged with it.

The invention disclosed as the embodiments may be applied to vehicles of other structures provided that the vehicle is equipped with a power storage device allowing external charging. For example, the invention disclosed as the embodiment can be applied to a series hybrid vehicle not using a power splitting mechanism, and also can be applied to a parallel hybrid vehicle. Further, the invention can be applied to an electric vehicle not equipped with an engine.

Although the present invention has been described and illustrated in detail, it is clearly understood that the same is by way of illustration and example only and is not to be taken by way of limitation, the scope of the present invention being interpreted by the terms of the appended claims.

The invention claimed is:

1. A vehicle power supply device, comprising:
    a power storage device;
    a charging device being capable of performing an internal charging operation for charging said power storage device with an electric power generated by a power generator inside the vehicle and an external charging operation for charging said power storage device by coupling to a power supply outside the vehicle;
    a control device for sensing a state of charge of said power storage device and controlling said charging device;
    a current sensing unit for sensing a current flowing into said power storage device; and
    a voltage sensing unit for sensing a voltage of said power storage device, wherein
    said control device executes first estimation processing of estimating the state of charge of said power storage device based on the current sensed by said current sensing unit and the voltage sensed by said voltage sensing unit when said internal charging operation is being performed using said charging device, and second estimation processing of estimating the state of charge of said power storage device by arithmetic different from arithmetic used in said first estimation processing based on the current sensed by said current sensing unit and the voltage sensed by said voltage sensing unit when said external charging operation is being performed using said charging device.

2. The vehicle power supply device according to claim 1, wherein
    said power generator inside the vehicle generates the electric power by receiving a drive power from an internal combustion engine inside the vehicle, and
    said charging device executes said internal charging operation for converging the state of charge of said power storage device to a target value during running of the vehicle.

3. The vehicle power supply device according to claim 2, wherein:
    said first estimation processing obtains a value SOC, where:

$$SOC=\int K1 \times Idt + K2 \times SOC(OCV)$$

where:
    K1 and K2 are predetermined weighting coefficients;
    I is a current sensed by the current sensing unit; and
    SOC(OCV) is a state of charge corresponding to the voltage sensed by the voltage sensing unit; and
    said second estimation processing obtains a value SOC, where:

$$SOC=\int K3 \times Idt + K4 \times SOC(OCV)$$

where:
    K3 and K4 are predetermined weighting coefficients different from K1 and K2;
    I is a current sensed by the current sensing unit; and
    SOC(OCV) is a state of charge corresponding to the voltage sensed by the voltage sensing unit.

4. The vehicle power supply device according to claim 1, wherein
    said power generator inside the vehicle performs a regenerative operation during wheel braking, and
    said charging device executes said internal charging operation during running of the vehicle.

5. The vehicle power supply device according to claim 4, wherein:
    said first estimation processing obtains a value SOC, where:

$$SOC=\int K1 \times Idt + K2 \times SOC(OCV)$$

where:
    K1 and K2 are predetermined weighting coefficients;
    I is a current sensed by the current sensing unit; and
    SOC(OCV) is a state of charge corresponding to the voltage sensed by the voltage sensing unit; and
    said second estimation processing obtains a value SOC, where:

$$SOC=\int K3 \times Idt + K4 \times SOC(OCV)$$

where:
  K3 and K4 are predetermined weighting coefficients different from K1 and K2;
  I is a current sensed by the current sensing unit; and
  SOC(OCV) is a state of charge corresponding to the voltage sensed by the voltage sensing unit.

6. The vehicle power supply device according to claim 1, wherein
  said control device executes a reset operation of discharging said power storage device and setting the state of charge of said power storage device to a predetermined state prior to said external charging operation when execution of said external charging operation is selected.

7. The vehicle power supply device according to claim 6, further comprising:
  a first and second map defining respectively a relationship between an upper limit value of a discharge power of said power storage device and the state of charge of said power storage device, wherein
    the first map is referred to during running of the vehicle, and
    the second map is referred to during execution of said reset operation, and is configured such that the upper limit value of the discharge power of said second map on a lower limit side of the state of charge is relaxed as compared with the upper limit value of the discharge power of said first map.

8. The vehicle power supply device according to claim 6, wherein:
  said first estimation processing obtains a value SOC, where:

$$SOC = \int K1 \times Idt + K2 \times SOC(OCV)$$

where:
  K1 and K2 are predetermined weighting coefficients;
  I is a current sensed by the current sensing unit; and
  SOC(OCV) is a state of charge corresponding to the voltage sensed by the voltage sensing unit; and
  said second estimation processing obtains a value SOC, where:

$$SOC = \int K3 \times Idt + K4 \times SOC(OCV)$$

where:
  K3 and K4 are predetermined weighting coefficients different from K1 and K2;
  I is a current sensed by the current sensing unit; and
  SOC(OCV) is a state of charge corresponding to the voltage sensed by the voltage sensing unit.

9. The vehicle power supply device according to claim 7, wherein:
  said first estimation processing obtains a value SOC, where:

$$SOC = \int K1 \times Idt + K2 \times SOC(OCV)$$

where:
  K1 and K2 are predetermined weighting coefficients;
  I is a current sensed by the current sensing unit; and
  SOC(OCV) is a state of charge corresponding to the voltage sensed by the voltage sensing unit; and
  said second estimation processing obtains a value SOC, where:

$$SOC = \int K3 \times Idt + K4 \times SOC(OCV)$$

where:
  K3 and K4 are predetermined weighting coefficients different from K1 and K2;
  I is a current sensed by the current sensing unit; and
  SOC(OCV) is a state of charge corresponding to the voltage sensed by the voltage sensing unit.

10. The vehicle power supply device according to claim 1, wherein:
  said first estimation processing obtains a value SOC, where:

$$SOC = \int K1 \times Idt + K2 \times SOC(OCV)$$

where:
  K1 and K2 are predetermined weighting coefficients;
  I is a current sensed by the current sensing unit; and
  SOC(OCV) is a state of charge corresponding to the voltage sensed by the voltage sensing unit; and
  said second estimation processing obtains a value SOC, where:

$$SOC = \int K3 \times Idt + K4 \times SOC(OCV)$$

where:
  K3 and K4 are predetermined weighting coefficients different from K1 and K2;
  I is a current sensed by the current sensing unit; and
  SOC(OCV) is a state of charge corresponding to the voltage sensed by the voltage sensing unit.

11. A method of estimating a state of charge of a power storage device in a vehicle power supply device including a power storage device, and a charging device being capable of performing an internal charging operation for charging said power storage device with an electric power generated by a power generator inside the vehicle and an external charging operation for charging said power storage device by coupling to a power supply outside the vehicle, wherein said vehicle power supply device further includes:
  a current sensing unit for sensing a current flowing into said power storage device; and
  a voltage sensing unit for sensing a voltage of said power storage device;
  the method comprising:
    a first estimation step of estimating the state of charge of said power storage device based on the current sensed by said current sensing unit and the voltage sensed by said voltage sensing unit when said internal charging operation is being performed using said charging device; and
    a second estimation step of estimating the state of charge of said power storage device by arithmetic different from arithmetic used in said first estimation step based on the current sensed by said current sensing unit and the voltage sensed by said voltage sensing unit when said external charging operation is being performed using said charging device, wherein the first and second estimation steps are performed by an electronic control unit.

12. The method of estimating the state of charge according to claim 11, wherein
  said power generator inside the vehicle generates the electric power by receiving a drive power from an internal combustion engine inside the vehicle, and
  said charging device executes said internal charging operation for converging the state of charge of said power storage device to a target value during running of the vehicle.

13. The method of estimating the state of charge according to claim 12, wherein:
  said first estimation step obtains a value SOC, where:

$$SOC = \int K1 \times Idt + K2 \times SOC(OCV)$$

where:
- K1 and K2 are predetermined weighting coefficients;
- I is a current sensed by the current sensing unit; and
- SOC(OCV) is a state of charge corresponding to the voltage sensed by the voltage sensing unit; and said second estimation processing obtains a value SOC, where:

$$SOC=\int K3 \times Idt + K4 \times SOC(OCV)$$

where:
- K3 and K4 are predetermined weighting coefficients different from K1 and K2;
- I is a current sensed by the current sensing unit; and
- SOC(OCV) is a state of charge corresponding to the voltage sensed by the voltage sensing unit.

14. The method of estimating the state of charge according to claim 11, wherein
said power generator inside the vehicle performs a regenerative operation during wheel braking, and
said charging device executes said internal charging operation during running of the vehicle.

15. The method of estimating the state of charge according to claim 14, wherein:
said first estimation step obtains a value SOC, where:

$$SOC=\int K1 \times Idt + K2 \times SOC(OCV)$$

where:
- K1 and K2 are predetermined weighting coefficients;
- I is a current sensed by the current sensing unit; and
- SOC(OCV) is a state of charge corresponding to the voltage sensed by the voltage sensing unit; and said second estimation processing obtains a value SOC, where:

$$SOC=\int K3 \times Idt + K4 \times SOC(OCV)$$

where:
- K3 and K4 are predetermined weighting coefficients different from K1 and K2;
- I is a current sensed by the current sensing unit; and
- SOC(OCV) is a state of charge corresponding to the voltage sensed by the voltage sensing unit.

16. The method of estimating the state of charge according to claim 11, further comprising:
a reset step of discharging said power storage device and setting the state of charge of said power storage device to a predetermined state prior to said external charging operation when execution of said external charging operation is selected.

17. The method of estimating the state of charge according to claim 16, wherein
said vehicle power supply device further includes a first and second map defining respectively a relationship between an upper limit value of a discharge power of said power storage device and the state of charge of said power storage device;
the first map is referred to during running of the vehicle, and
the second map is configured such that the upper limit value of the discharge power of said second map on a lower limit side of the state of charge is relaxed as compared with the upper limit value of the discharge power of said first map; and
said reset step discharges said power storage device with reference to said second map.

18. The method of estimating the state of charge according to claim 17, wherein:
said first estimation step obtains a value SOC, where:

$$SOC=\int K1 \times Idt + K2 \times SOC(OCV)$$

where:
- K1 and K2 are predetermined weighting coefficients;
- I is a current sensed by the current sensing unit; and
- SOC(OCV) is a state of charge corresponding to the voltage sensed by the voltage sensing unit; and said second estimation processing obtains a value SOC, where:

$$SOC=\int K3 \times Idt + K4 \times SOC(OCV)$$

where:
- K3 and K4 are predetermined weighting coefficients different from K1 and K2;
- I is a current sensed by the current sensing unit; and
- SOC(OCV) is a state of charge corresponding to the voltage sensed by the voltage sensing unit.

19. The method of estimating the state of charge according to claim 16, wherein:
said first estimation step obtains a value SOC, where:

$$SOC=\int K1 \times Idt + K2 \times SOC(OCV)$$

where:
- K1 and K2 are predetermined weighting coefficients;
- I is a current sensed by the current sensing unit; and
- SOC(OCV) is a state of charge corresponding to the voltage sensed by the voltage sensing unit; and said second estimation processing obtains a value SOC, where:

$$SOC=\int K1 \times Idt + K4 \times SOC(OCV)$$

where:
- K3 and K4 are predetermined weighting coefficients different from K1 and K2;
- I is a current sensed by the current sensing unit; and
- SOC(OCV) is a state of charge corresponding to the voltage sensed by the voltage sensing unit.

20. The method of estimating the state of charge according to claim 11, wherein:
said first estimation step obtains a value SOC, where:

$$SOC=\int K1 \times Idt + K2 \times SOC(OCV)$$

where:
- K1 and K2 are predetermined weighting coefficients;
- I is a current sensed by the current sensing unit; and
- SOC(OCV) is a state of charge corresponding to the voltage sensed by the voltage sensing unit; and said second estimation processing obtains a value SOC, where:

$$SOC=\int K3 \times Idt + K4 \times SOC(OCV)$$

where:
- K3 and K4 are predetermined weighting coefficients different from K1 and K2;
- I is a current sensed by the current sensing unit; and
- SOC(OCV) is a state of charge corresponding to the voltage sensed by the voltage sensing unit.

* * * * *